(12) United States Patent
Suzuki et al.

(10) Patent No.: US 9,327,968 B2
(45) Date of Patent: May 3, 2016

(54) VIBRATING ELEMENT, OPTICAL SCANNING DEVICE, ACTUATOR DEVICE, VIDEO PROJECTION APPARATUS, AND IMAGE FORMING APPARATUS

(75) Inventors: Naruki Suzuki, Kumagaya (JP); Katsumi Arai, Chichibu (JP); Takayuki Wakabayashi, Chichibu (JP)

(73) Assignee: CANON DENSHI KABUSHIKI KAISHA, Chichibu-shi (JP)

( * ) Notice: Subject to any disclaimer, the term of this patent is extended or adjusted under 35 U.S.C. 154(b) by 715 days.

(21) Appl. No.: 13/493,313

(22) Filed: Jun. 11, 2012

(65) Prior Publication Data

US 2012/0249804 A1 Oct. 4, 2012

Related U.S. Application Data

(63) Continuation of application No. PCT/JP2010/007277, filed on Dec. 15, 2010.

(30) Foreign Application Priority Data

Dec. 16, 2009 (JP) ................. 2009-284738

(51) Int. Cl.
  *H01L 41/08* (2006.01)
  *B81C 1/00* (2006.01)
  *G02B 26/08* (2006.01)

(52) U.S. Cl.
  CPC .......... *B81C 1/00658* (2013.01); *G02B 26/085* (2013.01); *B81B 2201/042* (2013.01)

(58) Field of Classification Search
  CPC ..................... B81C 1/00658; B81B 2201/042; G02B 26/085
  USPC .................. 310/328, 36; 348/206; 359/224.1; 148/400, 442
  See application file for complete search history.

(56) References Cited

U.S. PATENT DOCUMENTS

| 5,682,132 A | 10/1997 | Hiroyoshi et al. |
| 7,394,583 B2 | 7/2008 | Akedo et al. |
| 2007/0144867 A1* | 6/2007 | Torashima et al. ........ 198/346.1 |
| 2007/0279720 A1* | 12/2007 | Torashima et al. .......... 359/199 |

(Continued)

FOREIGN PATENT DOCUMENTS

| CN | 101126837 A | 2/2008 |
| JP | 08-283893 A | 10/1996 |

(Continued)

OTHER PUBLICATIONS

Chinese Office Action issued in Chinese Application No. 201080057002.4, dated May 21, 2014.

(Continued)

*Primary Examiner* — Thomas Dougherty
*Assistant Examiner* — Karen B Addison
(74) *Attorney, Agent, or Firm* — Fitzpatrick, Cella, Harper & Scinto

(57) ABSTRACT

A work hardening treatment which decreases the Young's modulus, and an age hardening treatment which recovers or increases the Young's modulus decreased by the work hardening treatment are performed to form a vibrating portion, thereby attaining a vibrating element advantageous in downsizing while ensuring desired fatigue characteristics and vibration characteristics. This downsizes, for example, an actuator device, an optical scanning device, a video projection apparatus, and an image forming apparatus.

21 Claims, 14 Drawing Sheets

(56) References Cited

U.S. PATENT DOCUMENTS

| | | |
|---|---|---|
| 2008/0043310 A1 | 2/2008 | Sato |
| 2010/0079837 A1 | 4/2010 | Akedo et al. |

FOREIGN PATENT DOCUMENTS

| | | |
|---|---|---|
| JP | 09-031577 A | 2/1997 |
| JP | 09-117721 A | 5/1997 |
| JP | 10-176232 A | 6/1998 |
| JP | 2006-293116 A | 10/2006 |
| JP | 2009-074104 A | 4/2009 |
| JP | 2009-109905 A | 5/2009 |
| WO | 2008/038649 A1 | 4/2008 |

OTHER PUBLICATIONS

PCT International Search Report and the Written Opinion of the International Searching Authority of PCT/JP2010/007277.

* cited by examiner

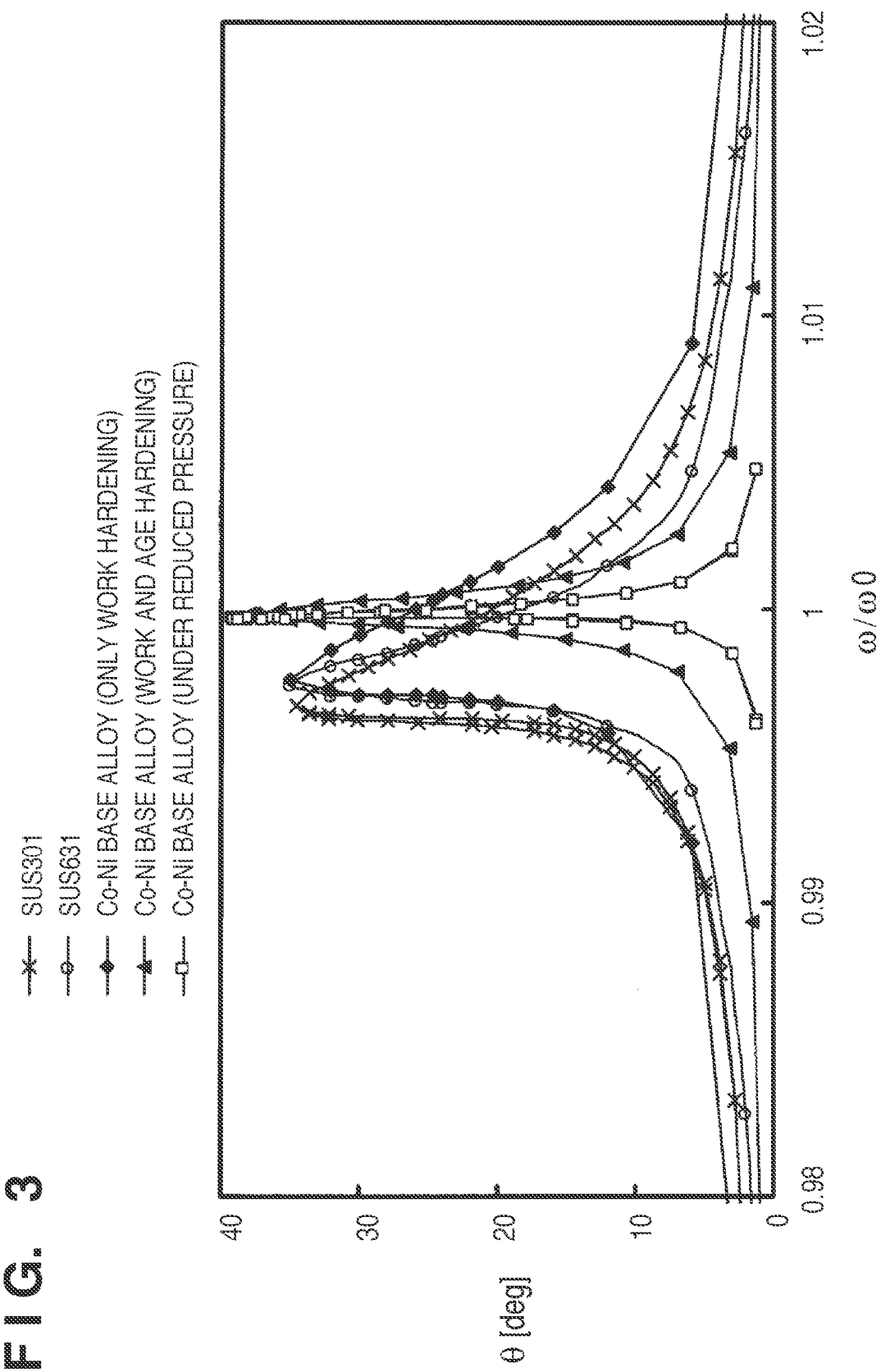
F I G. 3

FIG. 9

| | MATERIAL | MANUFACTURING METHOD | TEST ENVIRONMENT | ALLOWABLE STRAIN AMPLITUDE γ[×10⁻³] | ALLOWABLE STRAIN AMPLITUDE (θ [deg]) | Q VALUE θ=25° Q | CONSUMED POWER θ=25° P[mW] |
|---|---|---|---|---|---|---|---|
| EXAMPLE 1 | Co-Ni BASE ALLOY | WORK AND AGE HARDENING 550°C×2h | NORMAL PRESSURE | >10 | >50.0 | 1420 | 4.1 |
| | | | UNDER REDUCED PRESSURE | 3.5 | 38.6 | 4080 | 0.5 |
| COMPARATIVE EXAMPLE 1 | SUS301 | | NORMAL PRESSURE | 2.9 | 28.3 | 470 | 35.6 |
| | | | UNDER REDUCED PRESSURE | 2.6 | 24.9 | 550 | 26.2 |
| COMPARATIVE EXAMPLE 2 | SUS631 | | NORMAL PRESSURE | 3 | 29.7 | 590 | 22.9 |
| | | | UNDER REDUCED PRESSURE | 2.5 | 24.4 | 740 | 14.6 |
| COMPARATIVE EXAMPLE 3 | Co-Ni BASE ALLOY | ONLY WORK HARDENING | NORMAL PRESSURE | 4.2 | 46.6 | 380 | 53.3 |
| | | | UNDER REDUCED PRESSURE | 3.7 | 41.1 | 440 | 39.8 |

VIBRATING ELEMENT, OPTICAL SCANNING DEVICE, ACTUATOR DEVICE, VIDEO PROJECTION APPARATUS, AND IMAGE FORMING APPARATUS

This application is a continuation of PCT application No. PCT/JP2010/007277, filed on Dec. 15, 2010.

TECHNICAL FIELD

The present invention relates to, for example, a vibrating element, an optical scanning device, an actuator device, a video projection apparatus, and an image forming apparatus.

BACKGROUND ART

An optical scanning device such as an optical scanner, for example, has conventionally been known as a device including a vibrating element (see, for example, PTL1). In an optical scanning device described in PTL1, a twisted beam portion made of stainless steel is formed on a substrate, and a plate wave is induced in the substrate by, for example, a piezoelectric body, thereby swinging an optical mirror portion supported by the twisted beam portion.

CITATION LIST

Patent Literature

PTL1: Japanese Patent Laid-Open No. 2006-293116

SUMMARY OF INVENTION

Technical Problem

It is difficult to downsize the optical scanning device described in PTL1 because the twisted beam portion is formed by stainless steel.

More specifically, to downsize an optical scanning device, it is necessary to downsize both a vibrating element and a driving portion which controls vibration. This, in turn, makes it necessary to ensure the vibration characteristics of the optical scanning device and improve the efficiency of driving. When the vibrating element is downsized while, for example, a given resonance frequency and torsion angle are maintained, the stress acting on the twisted beam portion increases as the twisted beam portion shortens. Therefore, when a twisted beam portion made of stainless steel is to be shortened, this poses problems resulting from degradation in fatigue characteristic and that in driving efficiency with an increase in vibration damping factor. On the other hand, to reduce the vibration damping factor and improve the fatigue characteristics, it is possible to use, for example, precipitation hardening stainless steel for the twisted beam portion, but a further improvement in vibration characteristic is required to cope with downsizing in that case.

Also, when the twisted beam portion is shortened to downsize the vibrating element, spring nonlinearity more strongly appears with an increase in stress acting on the twisted beam portion, and the asymmetry of the frequency characteristics increases, so vibration at frequencies around the resonance frequency becomes unstable. In this case, it is possible to use vibration frequencies other than those around the resonance frequency. However, this eventually degrades the driving efficiency, thus making it difficult to downsize the vibrating element. Asymmetry that appears in these frequency characteristics is considerably influenced by the vibration damping factor. When the spring asymmetry remains the same and only the vibration damping factor reduces, the asymmetry in these frequency characteristics increases. Hence, to downsize the vibrating element while avoiding instability of vibration at frequencies around the resonance frequency, it is necessary to reduce both the spring asymmetry and the vibration damping factor.

Further, the vibration damping factor depends on, for example, the vibration damping property (internal friction) of a material which forms the twisted beam portion, and the air resistance of the optical mirror portion. When the air resistance is reduced by improving the shape of the optical mirror portion or decompressing the optical mirror portion so as to reduce jitter, only the vibration damping factor reduces, so vibration at frequencies around the resonance frequency is more likely to become unstable, thus making it more difficult to downsize the vibrating element.

In any case, because a vibrating element mounted in, for example, the conventional optical scanning device poses the above-mentioned various problems, an effective approach to downsizing the vibrating element while ensuring desired fatigue characteristics and vibration characteristics has not yet been proposed at present.

Note that the above-mentioned problems are also encountered in downsizing various optical apparatuses including vibrating elements, such as an optical scanning device, an actuator device, a video projection apparatus, and an image forming apparatus.

The present invention has been made in consideration of the above-mentioned situation, and provides a vibrating element, optical scanning device, actuator device, video projection apparatus, and image forming apparatus which can be downsized while ensuring desired fatigue characteristics and vibration characteristics.

Solution to Problem

A vibrating element according to the present invention comprises a vibrating portion formed by performing a work hardening treatment which decreases a Young's modulus, and an age hardening treatment which recovers or increases the Young's modulus decreased by the work hardening treatment.

In order to achieve the above-mentioned object, an optical scanning device according to the present invention comprises a vibrating portion formed by performing a work hardening treatment which decreases a Young's modulus, and an age hardening treatment which recovers or increases the Young's modulus decreased by the work hardening treatment, an optical mirror portion mounted on the vibrating portion, a driving portion which vibrates the vibrating portion, and a light source which irradiates a mirror surface of the optical mirror portion with light, wherein the device performs optical scanning based on vibration of the optical mirror portion by the vibrating portion.

In order to achieve the above-mentioned object, an actuator device according to the present invention comprises a vibrating portion formed by performing a work hardening treatment which decreases a Young's modulus, and an age hardening treatment which recovers or increases the Young's modulus decreased by the work hardening treatment, and a driving portion which vibrates the vibrating portion.

In order to achieve the above-mentioned object, a video projection apparatus according to the present invention comprises a vibrating portion formed by performing a work hardening treatment which decreases a Young's modulus, and an age hardening treatment which recovers or increases the Young's modulus decreased by the work hardening treatment, an optical mirror portion mounted on the vibrating portion, a driving portion which vibrates the vibrating portion, and a light source which irradiates a mirror surface of the optical mirror portion with light, wherein the apparatus projects a video by performing optical scanning based on vibration of the optical mirror portion by the vibrating portion.

In order to achieve the above-mentioned object, an image forming apparatus according to the present invention comprises a vibrating portion formed by performing a work hardening treatment which decreases a Young's modulus, and an age hardening treatment which recovers or increases the Young's modulus decreased by the work hardening treatment, an optical mirror portion mounted on the vibrating portion, a driving portion which vibrates the vibrating portion, and a light source which irradiates a mirror surface of the optical mirror portion with light, wherein the apparatus forms an image by performing optical scanning based on vibration of the optical mirror portion by the vibrating portion.

EFFECT OF INVENTION

The present invention can attain a vibrating element, optical scanning device, actuator device, video projection apparatus, and image forming apparatus advantageous in downsizing while ensuring desired fatigue characteristics and vibration characteristics.

Other features and advantages of the present invention will be apparent from the following descriptions taken in conjunction with the accompanying drawings, in which like reference characters designate the same or similar parts throughout the figures thereof.

BRIEF DESCRIPTION OF DRAWINGS

The accompanying drawings, which are incorporated in and constitute a part of the specification, illustrate embodiments of the invention and, together with the description, serve to explain the principles of the invention.

FIG. 3 is a graph showing a resonance characteristic curve representing the relationship between the amount of change in resonance frequency and the strain amplitude;

FIG. 9 is a table showing characteristic data of the vibrating element;

DESCRIPTION OF EMBODIMENTS

Figure 1:
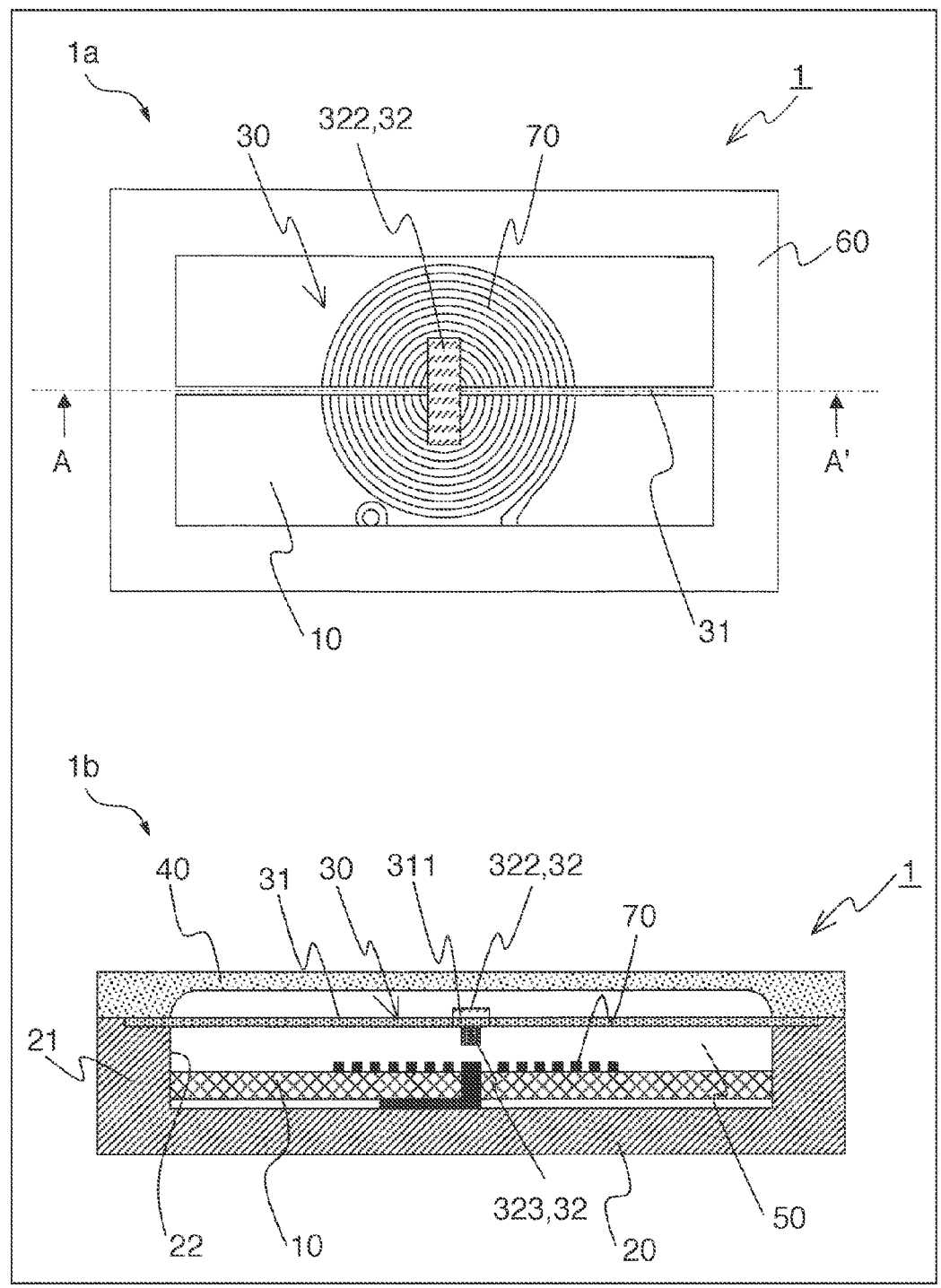
FIG. 1 is a schematic view illustrating an example of an actuator device including a vibrating element according to the first embodiment.

The present invention will be described in detail below with reference to embodiments.

A vibrating element according to the present invention includes a vibrating portion formed by performing a work hardening treatment which decreases the Young's modulus, and an age hardening treatment which recovers or increases the Young's modulus after the work hardening treatment.

More specifically, a vibrating portion is formed using a base material (workpiece) having a Young's modulus which is temporarily decreased by a work hardening treatment and is recovered or increased by a subsequent age hardening treatment. A practical example of the material which forms the vibrating portion is a material having undergone work hardening by strengthening at room temperature, and then age hardening by a strain aging heat treatment. That is, this material is obtained by introducing a dislocation at a density high enough to decrease its Young's modulus by plastic working, and inhibiting a dislocation motion to the degree that its Young's modulus recovers or increases by subsequent age hardening. Note that in the present invention, "the Young's modulus is recovered or increased by an age hardening treatment" includes, for example, increasing the Young's modulus to a given value from that before a work hardening treatment or increasing the Young's modulus to a value equal to or higher than that before the work hardening treatment. Also, in the present invention, "the Young's modulus is decreased by a work hardening treatment" includes, for example, decreasing the Young's modulus to the degree that it can be recovered or increased by a subsequent age hardening treatment.

Note that a metal material such as a work hardening and age hardening type Co—Ni base alloy or Co—Cr base alloy can be preferably used as the material which forms the vibrating portion. "The work hardening and age hardening type Co—Ni base alloy (or Co—Cr base alloy)" includes, for example, a Co—Ni base alloy (or Co—Cr base alloy) having effectively undergone a work hardening treatment and an age hardening treatment. The vibrating portion is formed by, for example, performing a work hardening treatment for a workpiece (starting material) serving as a work hardening and age hardening type Co—Ni base alloy to generate strain in the processed material, and then performing an age hardening treatment for the processed material.

More specifically, the starting material for forming the vibrating portion is a matrix which is obtained by processes such as hot forging or a homogenized heat treatment after ingot production, and contains a substitutional solute element, that is, contains at least Co and Ni. The workpiece undergoes a work hardening treatment by cold rolling, and then a shaping process such as press working, laser machining, and wire cutting to form a predetermined shape such as an elongated beam shape. The processed material undergoes an age hardening heat treatment in a vacuum or in a reducing atmosphere, thereby obtaining a vibrating portion effectively exhibiting good vibration characteristics defined by, for example, a high strength, a low damping capacity, and a high elastic limit.

When a shaping process in which the workpiece is formed into a predetermined shape as a vibrating portion is performed before a work hardening treatment, it can easily be done because the workpiece to be shaped is the starting material before hardening. However, because the shape of the vibrating portion changes upon the work hardening treatment after the shaping process, it is necessary to perform a shaping process again so as to form the vibrating portion into a predetermined shape. On the other hand, when a shaping process in which the vibrating portion is formed into a predetermined shape is performed after an age hardening treatment, it need only be performed once. However, the workpiece having undergone two-step hardening: work hardening and age hardening has considerably increased hardness, and therefore can hardly be formed into a predetermined shape. Hence, in the present invention, a shaping process in which the workpiece is formed into a predetermined shape as a vibrating portion is performed in the interval between a work hardening treatment and an age hardening treatment, in which the workpiece has its hardness increased upon the work hardening treatment but nonetheless can be relatively easily shaped.

Note that a material having mechanical characteristics (characteristics such as the tensile strength, hardness, and elongation percentage) which change depending on a change in heat treatment temperature for age hardening is preferably used as the material which forms the vibrating portion, as described above. A preferable example of the material of the vibrating portion is a material all mechanical characteristics of which improve upon a heat treatment at normal temperature. Another preferable example of the material of the vibrating portion is a material which has desired characteristics such as a desired tensile strength and hardness and has an elongation percentage that increases when the heat treatment condition exceeds a predetermined temperature or a temperature range. That is, it is desired to use a spring material having mechanical characteristics which are imparted to the vibrating portion in accordance with the heat treatment conditions, and can be appropriately adjusted by changing, for example, its components/composition. The material which forms the vibrating portion, as described above, is especially effective when, for example, the vibrating portion includes a beam portion suspended from a base in a beam shape (elongated shape), and torsionally vibrates in the direction in which it intersects with the longitudinal axis line of the beam portion, that is, when the vibrating portion is required to have high vibration characteristics (characteristics defined by an ultra-high elasticity, a high mechanical strength, and excellent durability).

Note that the workpiece which forms the vibrating portion has a face-centered cubic lattice structure with low stacking fault energy, and can effectively exploit the "Suzuki effect" in which a solute element segregates to a stacking fault to lock an extended dislocation. This makes it possible to widen the range of the extended dislocation to promote the Suzuki effect during work hardening and age hardening, thereby tightly locking the extended dislocation. The Suzuki effect is a locking mechanism which effectively acts even at high temperatures, and is especially effective during an aging heat treatment. An inhibition mechanism for a dislocation glide using the Cottrell effect of segregating a solute element to a dislocation core or minute transformation twinning can also be exploited in combination.

In such a workpiece, a high-density dislocation can be introduced by strengthening, so its strength and durability greatly improve upon work hardening but its Young's modulus decreases because the extended dislocation remains in this phase. In other words, work hardening is performed so as to introduce strain to the degree that the Young's modulus decreases. Then, the dislocation is tightly locked by an aging heat treatment so that the strength and durability can further improve and the Young's modulus can increase or recover to a given value or increase to a value higher than that before work hardening. When the dislocation is tightly locked to the degree that the Young's modulus increases or recovers to a given value or increases to a value higher than that before work hardening in this way, the internal friction of the vibrating portion due to vibration of a dislocation line reduces, so the Q value of the vibrating element greatly improves. Further, as the yield point rises upon an improvement in strength, and the internal friction of the vibrating portion reduces, the elastic limit improves, and the linear elastic region on a stress-strain diagram widens, that is, the linearity of the spring characteristics improves.

Also, in a material having a face-centered cubic lattice structure, its Young's modulus depends on the interatomic distance to have a maximum value in the <110> orientation, a minimum value in the <111> orientation, and an intermediate value in the <100> orientation. When the crystal is oriented by cold rolling, its Young's modulus exhibits anisotropy to have a maximum value in the direction in which a <110> texture is formed. Although the material is not particularly limited, a material oriented in the direction in which a <110> texture with a high Young's modulus is formed is preferably used for the vibrating portion in terms of strength against flexure, and an age hardening treatment is preferably performed so that its Young's modulus recovers or increases in this direction.

Also, the vibrating portion may be formed using a wire rod having undergone work hardening by cold wire drawing. Moreover, a material having undergone control of texture formation by performing cold rolling for a wire rod formed by cold wire drawing may similarly be used.

At this time, superplastic forming may be used as a shaping process. Also, an age hardening treatment is preferably performed based on a temperature which allows effective progress of age hardening, such as that appropriately adjusted in accordance with the condition of a work hardening treatment. Depending on the condition of a work hardening treatment, an age hardening treatment can be performed by a heat treatment at a temperature equal to or lower than the recrystallization temperature, for example, a temperature of about 400° C. to 700° C. for several ten minutes to several hours. Also, such a heat treatment may be performed in a strong magnetic field of 1 T or more to promote the Suzuki effect, thereby shortening the treatment time.

The vibrating portion is implemented as an elongated beam. When the vibrating portion includes first and second regions in which the optical mirror portion is not mounted along its longitudinal direction, and a third region in which the optical mirror portion is mounted along this longitudinal direction, the third region is sandwiched between the first and second regions in this longitudinal direction, so an age hardening treatment may be performed in the first and third regions at different temperatures. In this case, it is desired to use a spring material having mechanical characteristics which are imparted to the vibrating portion in accordance with the heat treatment conditions, and can be appropriately adjusted by changing, for example, its components/composition. For example, to functionally separate, as portions having different mechanical characteristics, the first and second regions in which the optical mirror portion is not mounted, and the third region in which the optical mirror portion is mounted, a heat treatment may be performed while individually changing the heating conditions. The mechanical characteristics mean herein the reaction property to externally applied forces (external forces) such as tension, bending, compression, shearing, hardness, impact, and fatigue. It is especially preferable to set high hardness as the mechanical characteristics in the third region in which the optical mirror portion is mounted, and strong tensile characteristics/high fatigue characteristics as the mechanical characteristics in the first and second regions in which the optical mirror portion is not mounted.

According to the present invention, as described above, a work hardening treatment which decreases the Young's modulus and an age hardening treatment which recovers or increases the Young's modulus decreased by the Work hardening treatment are performed to form a vibrating portion, thereby improving, for example, the fatigue characteristics and mechanical characteristics of the vibrating portion. Also, according to the present invention, the vibration damping factor is very low, and especially the spring nonlinearity is low enough not to cause instability even for such a low vibration damping factor, so the strain amplitude dependence of the vibration damping factor becomes very low. This makes it possible to downsize, for example, a vibrating element having desired fatigue characteristics and vibration characteristics, and an actuator device including the vibrating element, and, in turn, to reduce the power consumed by the vibrating element.

More specifically, a vibrating portion to serve as the strain deformation portion of a vibrating element is formed by, for example, the above-mentioned work hardening and age hardening type Co—Ni base alloy. When this is done, the vibrating portion has high strength, a wide linear elastic region, and a low internal friction. For example, the vibrating portion is imparted with characteristics defined by a resonance characteristic curve which represents the relationship between the amount of change in resonance frequency and the strain amplitude and has a sharp, axisymmetric peak shape, that is, those exhibiting a high Q value and spring characteristics with very low nonlinearity. Such a vibrating portion does not generate unstable vibration even if the maximum strain amplitude due to vibration deformation is as high as about $3\times10^{-3}$, and therefore consumes only low power. On the other hand, the vibrating portion has a high degree of ease in vibration, that is, a Q value of 1,000 or more, so its vibration damping factor is very low and its spring characteristics have low nonlinearity. Hence, manufacturing an optical device such as an optical scanning device using such a vibrating portion makes it possible to greatly reduce the power consumed by the optical device while improving its vibration characteristics. Therefore, the present invention can attain a vibrating element, optical scanning device, and image forming apparatus advantageous in downsizing while ensuring desired fatigue characteristics and vibration characteristics.

The "Co—Ni base alloy" means an alloy containing cobalt [Co] and nickel [Ni]. The "Co—Ni base alloy" preferably contains, for example, chromium [Cr] which reduces the stacking fault energy, and molybdenum [Mo] or iron [Fe] as a solute element which contributes to locking a dislocation by matrix solid-solution strengthening and segregation, thereby improving the age hardening and work hardening performances. Examples of the "Co—Ni base alloy" include a Co—Ni—Cr—Mo alloy and Co—Ni—Fe—Cr alloy. Also, these alloys may contain, for example, niobium [Nb] which acts in the same way as a solute element, manganese [Mn] which stabilizes the face-centered cubic lattice phase to reduce the stacking fault energy, tungsten [W] which contributes to strengthening the matrix and reducing the stacking fault energy, titanium [Ti] which contributes to miniaturizing the ingot structure and improving its strength, boron [B] which improves the hot workability, or carbon [C] which dissolves, for example, magnesium [Mg] in the matrix to form a carbide using, for example, Cr, Mo, or Nb, thereby strengthening the grain boundary.

The Co—Ni—Cr—Mo alloy preferably contains, as its major composition, Co, Ni, and Cr+Mo at a weight ratio of 20.0% to 50.0% :20.0% to 45.0% :20.0% to 40.0% (Cr: 18% to 26%, Mo: 3% to 11%), and more preferably contains Co, Ni, Cr, and Mo at a weight ratio of 31.0% to 37.3%, 31.4% to 33.4%, 19.5% to 20.5%, and 9.5% to 10.5%. The formation of a vibrating portion using a Co—Ni—Cr—Mo alloy having the above-mentioned composition is very advantageous in downsizing, for example, the vibrating element. In such an alloy, a <100> texture is formed in the rolling direction, and a <110> texture is formed in a direction perpendicular to the rolling direction, so a material oriented in the direction perpendicular to the rolling direction is preferably used for the vibrating portion. Also, it is optimum to perform an aging heat treatment of such an alloy at a temperature of 500° C. to 600° C. for about two hours.

Note that in the present invention, a vibrating portion is preferably formed by a work hardening and age hardening type Co—Ni base alloy exhibiting nonmagnetism, such as a Co—Ni—Cr—Mo alloy having the above-mentioned composition. This is because stable electromagnetic driving can be attained when a magnetic field generating portion, for example, is adopted as a driving portion which vibrates the vibrating portion. Note that the driving portion is not limited to a magnetic field generating portion, and a piezoelectric element, for example, may be adopted. In the latter case, the magnetic property of the driving portion is not particularly limited.

Also, in the present invention, at least part of the vibrating element, which comprises a work hardening and age hardening type Co—Ni base alloy, is preferably located in a reduced-pressure space forming portion (seal structure) which forms a reduced-pressure space. This is because the vibration characteristics can be better in a reduced-pressure space than in a normal-pressure space. Especially when the vibrating portion includes various functional portions and, more specifically, an optical mirror and the like to manufacture a high-functionality device, it is more preferable to locate, for example, functional portions as at least part of the above-mentioned vibrating portion in the reduced-pressure space forming portion. This makes it possible to reduce the influence that the air resistance exerts on, for example, the functional portions, thereby further improving the vibration characteristics. In the present invention, the reduced-pressure space forming portion may cover the entire vibrating portion or the entire structure such as the functional portions.

Note that in the present invention, a vibrating portion is preferably formed using a work hardening and age hardening type Co—Ni base alloy, as described above. However, the present invention is not particularly limited to this, and any material can be preferably employed as long as, for example, its Young's modulus decreases upon a work hardening treatment, and, upon a subsequent age hardening treatment, increases to a given value, recovers to the same value as that before the work hardening treatment, or increases to a value higher than that after the work hardening treatment.

Practical examples of an actuator device, optical scanning device, image forming apparatus, and video projection apparatus including a vibrating element according to the present invention will be described in detail below based on the following embodiments with reference to the accompanying drawings.

(First Embodiment)

Figure 2:
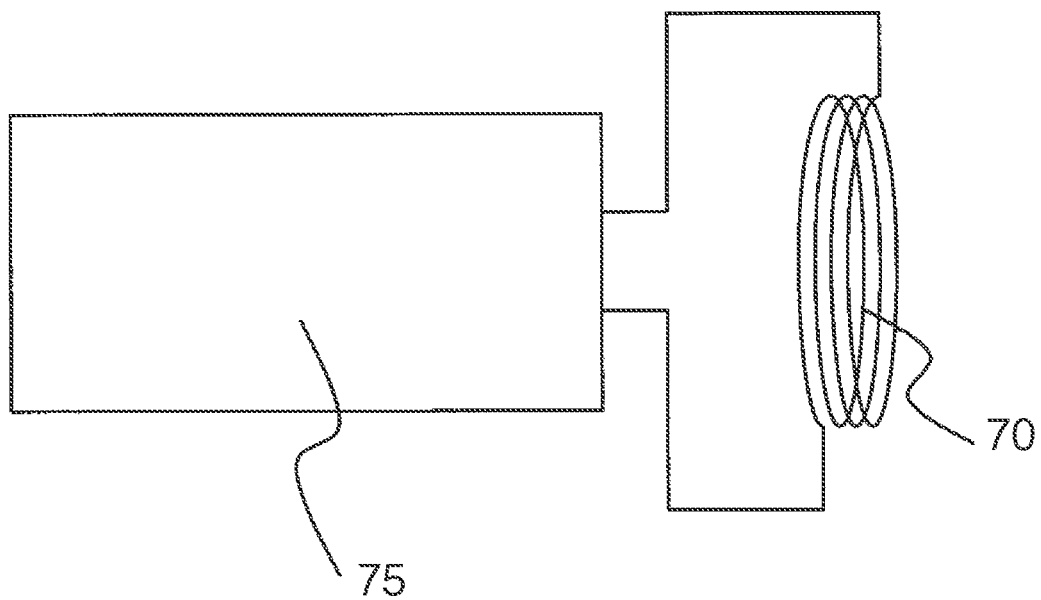
FIG. 2 is a schematic view illustrating an example of a driving portion to be connected to the actuator device in the first embodiment.

FIG. 1 is a schematic view illustrating an example of an actuator device including a vibrating element according to the first embodiment of the present invention, in which 1a of FIG. 1 is a schematic top view; and 1b of FIG. 1 is a sectional view taken along a line A-A'. Also, FIG. 2 is a schematic view illustrating an example of a driving portion to be connected to the actuator device shown in FIG. 1.

An actuator device 1 according to the first embodiment is a vibrating mirror device and includes a substrate 10, a holding member 20 which mounts the substrate 10, and a vibrating element 30, as shown in 1a and 1b of FIG. 1. In the first embodiment, the holding member 20 includes an annular flange portion 21 along the peripheral edge portion of the substrate 10, and has a central portion which forms a recessed portion 22, as shown in 1a and 1b of FIG. 1. In the first embodiment, the vibrating element 30 is mounted in the recessed portion 22 so that it is located in a reduced-pressure space 50 formed (partitioned) by the substrate 10, the holding member 20, and a cover member 40.

Also, the vibrating element 30 includes a frame (outer frame portion) 60 serving as a connecting portion to the holding member 20, a beam portion 31 which is suspended between the two opposed end portions of the frame 60 across the recessed portion (opening) 22 in the holding member 20, and a mass body (functional portion) 32 placed at the central portion of the beam portion 31 in the longitudinal direction, that is, the portion corresponding to the center of the opening in the holding member 20. Moreover, a magnetic field generating portion 70 is formed on the substrate 10 in the portion opposed to the mass body 32.

In this case, the beam portion 31 which forms the deformation portion of the vibrating element 30 is formed using a material having a Young's modulus which decreases upon a work hardening treatment and increases upon a subsequent age hardening treatment, for example, a work hardening and age hardening type Co—Ni base alloy exhibiting nonmagnetism in this embodiment. As the work hardening and age hardening type Co—Ni base alloy exhibiting nonmagnetism as described above, a Co—Ni—Cr—Mo alloy named SPRON510 (a product named SPRON® available from Seiko Instruments Inc.), for example, can be used. Note that the strength of a workpiece such as SPRON510 as described above is increased by, for example, strengthening such as rolling, and a heat treatment is performed for this material to form the beam portion 31, thereby obtaining a vibrating element 30 having high vibration characteristics such as low damping capacity characteristics.

Also, the beam portion 31 can be formed into a predetermined shape such as an elongated beam shape by, for example, press working, laser machining, and wire cutting. At this time, superplastic forming, for example, may be used as the shaping process. Note that a wire rod which exhibits nonmagnetism and is made of a work hardening and age hardening type Co—Ni base alloy may be connected to the frame 60 to form the beam portion 31. The thus formed beam portion 31 is obtained by performing the above-mentioned work hardening treatment, and then, for example, a heat treatment as an age hardening treatment for improving the vibration characteristics. The heat treatment for the beam portion 31 at this time may be done at a temperature of 400° C. to 700° C. for several ten minutes to several hours, but can also be done in, for example, a strong magnetic field so as to shorten the treatment time.

Note that in the present invention, a vibrating portion is preferably implemented by a beam portion formed by stretching, that formed by ironing while stretching a rod-shaped material, or that formed by stretching and then ironing. This makes it possible to attain a beam portion with higher straightness and, in turn, to stabilize torsional deformation repeated in the vibrating portion. More specifically, a beam portion is obtained by performing a work hardening treatment and then, for example, a heat treatment as an age hardening treatment so as to improve the vibration characteristics. However, a beam portion formed in a rod shape may suffer warpage and degrade in straightness. When the beam portion has such warpage, it may hamper a smooth swing motion of a swing body such as an optical mirror mounted on the beam portion, resulting in a reduction in swing angle of the optical reflecting surface for input energy. The "swing angle" means herein the angle formed between two swing ends at which the direction in which the above-mentioned swing body swings changes when, for example, this swing body swings using the longitudinal axis line of the beam portion as a center. When the swing body is fixed on the beam portion having warpage as described above, the longitudinal axis line of the beam portion does not coincide with an ideal swing axis line (the axis line of the beam portion when it has no warpage), so the swing state of the swing body is more likely to be unstable. As a result, to swing the optical reflecting surface of the swing body at a desired swing angle, it is necessary to, for example, apply a larger amount of electric energy to the vibrating portion. Therefore, to reduce the amount of warpage of the beam portion, that is, to improve its straightness, it is especially effective to stretch the beam portion or iron a rod-shaped material during dicing, that is, to iron the beam portion while applying tension to it or ironing the beam portion after stretching, in terms of improving the vibration characteristics. Note that a trace may be formed in the outer peripheral surface of the beam portion due to such stretching.

Also, an etching process may be performed for the beam portion after the shaping or heat treatment. The above-mentioned heat treatment temperature and treatment time are optimally set in accordance with, for example, the material composition and the strengthening rate. However, if the strain and heat history are different between the outer periphery and interior of the beam cross-section due to stress or heat acting during shaping, the outer peripheral portion undergoes a heat treatment too little or too much, so a deteriorated layer having a low Young's modulus, low hardness, and high material nonlinearity is obtained. This deteriorated layer functions as a vibration damping member which absorbs beam vibration, leading to a decrease in Q value. Also, since this deteriorated layer is present on the outer peripheral portion of the cross-section, which is applied with high stress upon torsional vibration, its material characteristics considerably influence the spring characteristics and increase the nonlinearity, leading to vibration instability. The influence of this deteriorated layer is serious especially when the beam portion is thinly formed to downsize the vibrating element. Hence, to obtain the effect of the present invention, it is effective to remove the deteriorated layer. A Co—Ni base alloy is a material which can hardly be etched because of its excellent corrosion resistance, but its surface can be removed at a depth of several ten micrometers by processing it at a temperature of about 50° C. to 70° C. for several minutes to several hours as needed using an etching solution such as a mixed solution of ceric ammonium nitrate and perchloric acid.

For example, in this embodiment, a plate-shaped member (not shown) is formed by performing a work hardening treatment such as rolling for a workpiece (starting material) serving as a work hardening and age hardening type Co—Ni base alloy, and undergoes an age hardening treatment after being formed into a predetermined shape, thereby forming the beam portion 31. In this case, in the work hardening treatment and age hardening treatment in manufacturing a plate-shaped member, the <100> crystal orientation of the plate-shape member is set in the rolling direction, the <110> crystal orientation of the plate-shape member is set in a direction perpendicular to the rolling direction within the plane of the plate-shape member, and the plate-shape member is processed so as to increase its Young's modulus in the direction perpendicular to the rolling direction.

Note that a mirror mounting portion 311 on which an optical mirror portion 322 (to be described later) is to be mounted is formed almost at the central portion of the beam portion 31 to have a width larger than that of the beam portion 31. In this embodiment, the mirror mounting portion 311 is formed integrally with the beam portion 31 simultaneously with the formation into the shape of the beam portion 31.

Also, the mass body 32 formed on the beam portion 31 includes the optical mirror portion 322 mounted on the mirror mounting portion 311, and a magnet 323 placed on the lower surface of the mirror mounting portion 311, that is, the surface of the mirror mounting portion 311, which is opposite to the optical mirror portion 322, as shown in 1b of FIG. 1.

Note that each of the optical mirror portion 322 and mirror mounting portion 311 is formed to have an outer shape having a width larger than that of the beam portion 31, and has, for example, a plate shape and a rectangular outer shape in this embodiment. Also, the magnet 323 is placed to reach the two end portions of the mirror mounting portion 311 in the longitudinal direction. Furthermore, in this embodiment, the magnet 323 is placed so that its north-to-south direction is the horizontal direction, that is, is parallel to the in-plane direction of the substrate 10. On the other hand, the magnetic field generating portion 70 on the substrate 10 is formed by a coil-shaped metallic pattern and placed in the region opposed to the mass body 32.

The optical mirror portion 322 may be, for example, a reflecting film formed using Al, Au, or Ag by vapor deposition, or may be obtained by connecting or bonding a mirror-finished member such as a silicon wafer to the mirror mounting portion 311, and therefore is not particularly limited.

However, a Co—Ni base alloy poses a problem resulting from its ozone resistance, that is, a passive film containing Co or Cr reacts upon exposure to, for example, ozone gas to form pits in the surface, so an ozone-resistant member is desirably used for the optical mirror portion when this alloy is used in, for example, an image forming apparatus. This pit formation by ozone exerts a more serious influence on the connecting portion and the flatness of the surface of the optical mirror portion than on the beam mechanical characteristics, leading to decreases in reflectance and connection strength. When a reflecting film is formed, a protective film containing, for example, $SiO_2$ or $TiO_2$ is desirably formed. However, when a mirror-finished member is connected to the mirror mounting portion 311, an ozone-resistant resin, for example, is desirably formed on the connecting portion or member end face.

On the other hand, the magnet 323 is required to be as small as possible so that its weight load on the vibrating element 30 is kept low, and to have a sufficient magnetic force, so an Nd—Fe—B base magnet or an Sm—Co base magnet, for example, can be preferably used as the type of magnet 323. Also, the form of the magnet 323 may be, for example, a sintered magnet, a bonded magnet, or a thin film magnet formed by, for example, sputtering, and is not particularly limited.

The magnetic field generating portion 70 which applies a magnetic field to the magnet 323 is not particularly limited as long as it applies to the magnet 323 a torque which excites torsional vibration in the vibrating element 30. The magnetic field generating portion 70 may be, for example, a sheet coil as shown in 1a of FIG. 1, or a coil including an internal soft magnetic body as a yoke. Also, the magnetic field generating portion 70 may be formed on the two sides of the vibrating element 30 to fall within the range in which it does not shade the optical mirror portion 322.

Note that the magnetic field generating portion 70 is not particularly limited as long as it can be connected to a driving circuit 75 which forms part of the driving portion, as shown in FIG. 2, and can output a signal including frequencies around the resonance frequency of the vibrating element 30. The magnetic field generating portion 70 may output, for example, a triangular wave or a pulse in place of a sinusoidal wave.

In the actuator device 1 according to this embodiment having the above-mentioned structure, the magnet 323 receives a rotational force from a magnetic field generated by the magnetic field generating portion 70 driven by the driving circuit 75 to excite torsional vibration in the vibrating element 30 including the mass body 32 and beam portion 31. More specifically, when a magnetic field is generated by the magnetic field generating portion 70, the magnet 323 is subjected to the action of its magnetic field to apply a rotational force to the mass body 32, and the beam portion 31 torsionally deforms by interlocking. Torsional deformation of the beam portion 31 is repeatedly generated under the control of the driving circuit 75, thereby allowing the optical mirror portion 322 to function as a vibrating mirror (functional portion) which moves one-dimensionally.

A resonance frequency f of the vibrating element is given by:

$$f=(1/2\pi)\{k/(Im+It)\}^{1/2}$$

where k is the spring constant of the beam portion, It is the moment of inertia about the torsion center axis of the beam portion, and Im is the moment of inertia of the overall mirror portion including the magnet. The shapes of the beam portion and mirror portion need only be set so as to obtain desired characteristics. However, when, for example, the moment of inertia of the mirror portion is decreased and the thickness of the beam portion is increased to increase the spring constant, so as to increase the resonance frequency of the vibrating element and thereby attain a speedup, nonlinearity appears and vibration becomes unstable. This phenomenon is conspicuous especially when the shape of the mirror portion is improved so as to reduce the air resistance, so instability occurs due to the appearance of nonlinearity with an improvement in Q value and a decrease in moment of inertia of the mirror portion.

Figure 10:
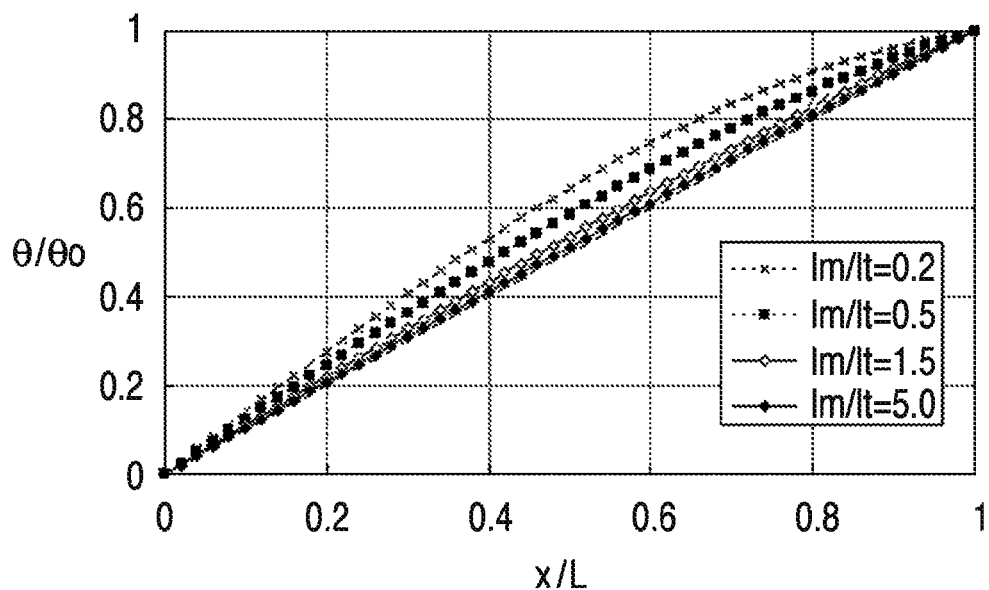
FIG. 10 is a graph showing the torsion angle of the beam portion at each position when the moment of inertia of the mirror portion changes while the shape of the beam portion remains the same.

FIG. 10 is a graph showing the torsion angle of the beam portion when the moment of inertia of the mirror portion changes while the shape of the beam portion remains the same. The abscissa indicates the position of the beam portion in the torsion axis direction, which is expressed by x/L obtained by normalizing the position x using the length L of the beam portion. The beam portion is fixed at a position x=0, and is connected to the mirror portion at a position x=L. The ordinate indicates the torsion angle e at each position x/L, which is expressed by a value normalized using a maximum torsion angle $\theta_0$ of the position at which the beam portion is connected to the mirror portion. With a change in moment of inertia Im of the mirror portion, as the ratio Im/It of the moment of inertia Im of the mirror portion to the moment of inertia It of the beam portion reduces, the torsion angle becomes less uniform, so the beam portion more considerably twists on the side of the fixing position.

Figure 11:
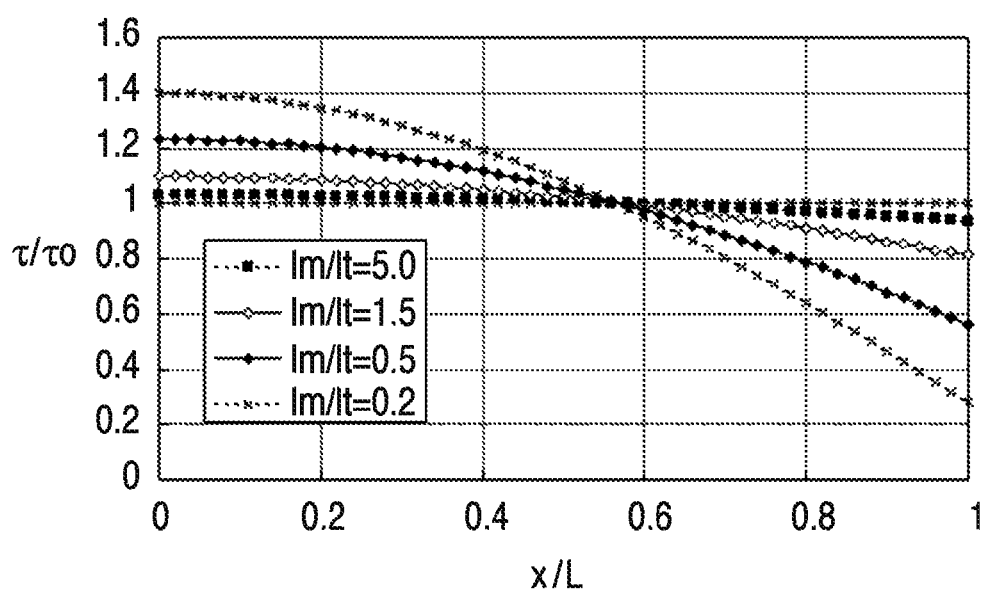
FIG. 11 is a graph showing the distribution of the shearing stress of the beam portion at each position when the beam shape remains the same and the moment of inertia of the mirror portion changes.
Figure 12:
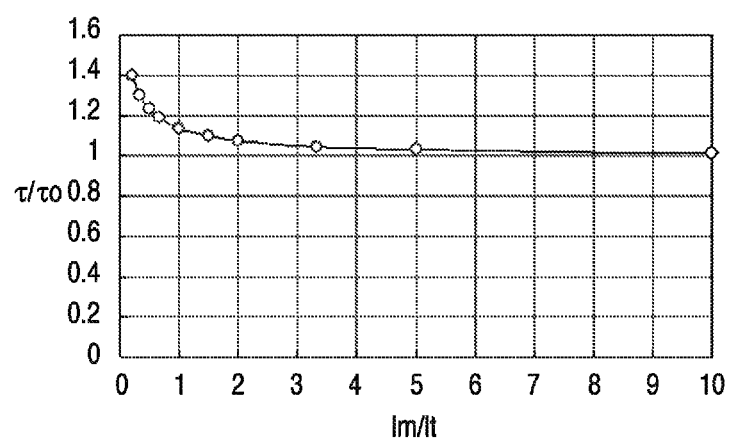
FIG. 12 is a graph showing the maximum stress value on the side of the fixing position of the beam portion as a function of the ratio of the moment of inertia.

FIG. 11 is a graph showing the distribution of shearing stress at each position at that time, and shows the position x/L obtained by normalization on the abscissa, and the shearing stress with reference to that when the torsion angle is uniform on the ordinate. As the ratio Im/It of the moments of inertia reduces, the stress on the side of the fixing position increases. With this increase in stress, material nonlinearity becomes more likely to appear on the side of the fixing position, and vibration instability becomes more likely to occur, compared to the case wherein the torsion angle is uniform. FIG. 12 is a graph showing the maximum stress value on the side of the fixing position in FIG. 11 as a function of the ratio Im/It of the moments of inertia. Because the stress rapidly increases at a ratio Im/It of 2 or less, the moment of inertia of the overall mirror portion is desirably twice or more that of the beam portion, and is more desirably five times or more that of the beam portion so as to prevent the occurrence of vibration instability.

Figure 13:
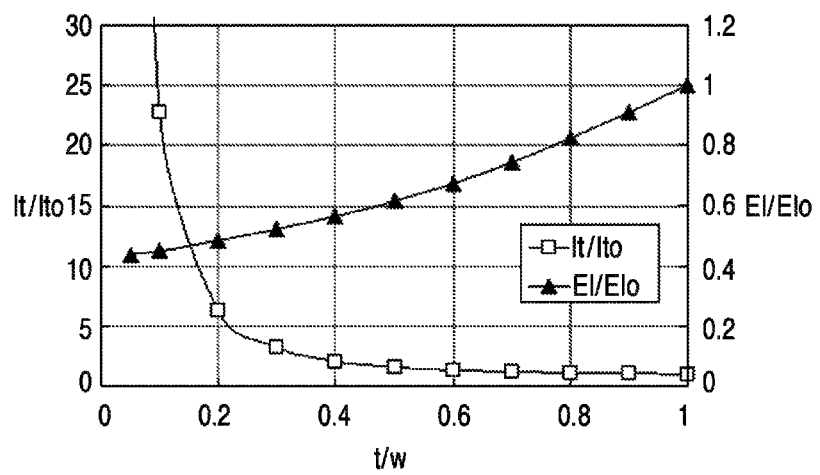
FIG. 13 is a graph showing the changes in flexural rigidity and moment of inertia of the beam portion for the cross-section aspect ratio of the beam portion.

Also, because the vibrating element according to the present invention has a high Q value, flexural vibration generated upon, for example, an external impact can hardly be damped. To suppress or quickly damp flexural vibration, it is necessary to improve the flexural rigidity of the beam portion so as to keep the resonance frequency of a flexural vibration mode as high as possible. FIG. 13 is a graph showing the change in flexural rigidity of the beam portion and that in moment of inertia of the beam portion for the thickness of the beam portion relative to its width, that is, the cross-section aspect ratio of the beam portion. Each line in the graph shown in FIG. 13 is normalized using a value when the cross-section aspect ratio is 1. FIG. 13 shows the change for the cross-section aspect ratio t/w when the width w and thickness t of the beam portion are set so as to obtain the same spring constant while the length of the beam portion is fixed. Referring to FIG. 13, a flexural rigidity EI becomes higher as the cross-section aspect ratio comes closer to 1. Also, as described above, the ratio Im/It of the moments of inertia of the mirror portion and beam portion is desirably as high as possible. To achieve this, the moment of inertia of the beam portion is desirably as small as possible. As can be seen from FIG. 13, the moment of inertia of the beam portion rapidly increases at an aspect ratio of 0.3 or less. Hence, to prevent the occurrence of vibration instability and improve the flexural rigidity so as to suppress various types of vibration other than torsional vibration, the cross-section aspect ratio t/w of the beam portion is desirably 0.3 or more and is more desirably 0.5 or more.

As described above, since the beam portion 31 to be torsionally deformed is formed by a work hardening and age hardening type Co—Ni base alloy in this embodiment, the fatigue characteristics and mechanical characteristics, for example, can be dramatically better in this embodiment than when the beam portion 31 is formed by, for example, stainless steel. Also, the present invention provides a vibrating element 30 having a very low vibration damping factor and, especially, a vibrating element 30, having a spring nonlinearity low enough not to cause instability despite a low vibration damping factor, and a vibration damping factor with very low strain amplitude dependence.

Hence, according to this embodiment, the vibrating element 30 can be downsized by shortening the beam portion 31 while ensuring desired fatigue characteristics and vibration characteristics. Also, by applying the thus downsized vibrating element 30 to a device structure such as a MEMS (Micro Electro-Mechanical Systems) mirror or an optical switch, this device structure can be reduced together with components associated with driving. This makes it possible not only to downsize the entire device structure but also to obtain desired vibration characteristics, thus attaining a high-functionality device which consumes only low power. Especially in this embodiment, by locating the vibrating element 30 containing the above-mentioned work hardening and age hardening type Co—Ni base alloy in the reduced-pressure space 50, the vibration characteristics can be better than in a normal-pressure space. It is also possible to reduce the influence of the air resistance acting on, for example, the functional portions, thus improving the functionality.

In the vibrating element 30 applied to the actuator device 1 according to this embodiment, the beam portion 31 which forms the main part of the vibrating portion is made of a work hardening and age hardening type Co—Ni base alloy, thereby obtaining characteristics defined by a resonance characteristic curve which represents the relationship between the amount of change in resonance frequency and the strain amplitude and has an axisymmetric peak shape, that is, vibration characteristics exhibiting spring characteristics with very low nonlinearity.

FIG. 3 shows a resonance characteristic curve (frequency characteristics) representing the relationship between the amount of change in resonance frequency and the strain amplitude for each of a vibrating element according to Example 1 manufactured based on the structure (FIG. 1) of the vibrating element 30 according to the above-mentioned first embodiment, and vibrating elements according to Comparative Examples 1 to 3. The abscissa indicates the normalized angular frequency $\omega/\omega_0$, and the ordinate indicates the torsional amplitude $\theta$ (degrees). An angular frequency (extrapolated) value when the torsional amplitude is zero is used as the $\omega_0$ value.

EXAMPLE 1

A vibrating portion formed by performing as an aging treatment a heat treatment for a rolled material named SPRON510 having a composition of 35% Co, 32% Ni, 20% Cr, and 10% Mo as a work hardening and age hardening type Co—Ni base alloy at 550° C. for two hours was used as a vibrating element in Example 1. Note that the resonance frequency of the vibrating element in Example 1 was about 2 kHz.

COMPARATIVE EXAMPLE 1

A vibrating element having the same structure as that in Example 1 except that the former has a vibrating portion made of SUS301 with good mechanical characteristics among austenitic stainless steel materials such as SUS304 was manufactured and used as that in Comparative Example 1.

COMPARATIVE EXAMPLE 2

A vibrating element having the same structure as that in Example 1 except that the former has a vibrating element made of precipitation hardening stainless steel SUS631 was manufactured and used as that in Comparative Example 2.

COMPARATIVE EXAMPLE 3

A vibrating element that has the same structure as that in Example 1 except that the former was processed only by work hardening was used as that in Comparative Example 3.

As shown in FIG. 3, when the resonance frequency characteristics of the vibrating element in Example 1 are compared with those of the vibrating elements in Comparative Examples 1 to 3, the vibrating elements made of SUS301, SUS631, and the Co—Ni base alloy processed only by work hardening in Comparative Examples 1 to 3, respectively, have low Q values of vibration, that is, have high vibration damping factors and asymmetric resonance characteristics, so their spring characteristics exhibit nonlinearity.

In contrast to this, the vibrating element in Example 1 exhibits characteristics defined by a resonance characteristic curve having an axisymmetric peak shape, that is, exhibits vibration characteristics having spring characteristics with very low nonlinearity. Especially the vibrating element in Example 1 has high vibration characteristics with little nonlinearity despite its very sharp characteristics under the reduced pressure.

As described above, the vibrating element in Example 1 exhibits high vibration characteristics having spring characteristics with very low nonlinearity, and therefore can have a given level of freedom of design while ensuring desired vibration characteristics. That is, the vibration characteristics of the vibrating element in Example 1 can be dramatically better than those of the vibrating elements manufactured using the materials in, for example, Comparative Example 1 (SUS301) and Comparative Example 2 (SUS631) as the workpieces of the vibrating portions. For this reason, in mounting the vibrating element in Example 1 in an electronic device such as an optical scanning device, it is possible to dramatically improve the level of freedom of design in terms of downsizing the vibrating element, readjusting the element structure, or changing, for example, its dimension. Hence, the vibrating element in Example 1 can attain various compact electronic devices while maintaining a given device performance.

Figure 4:
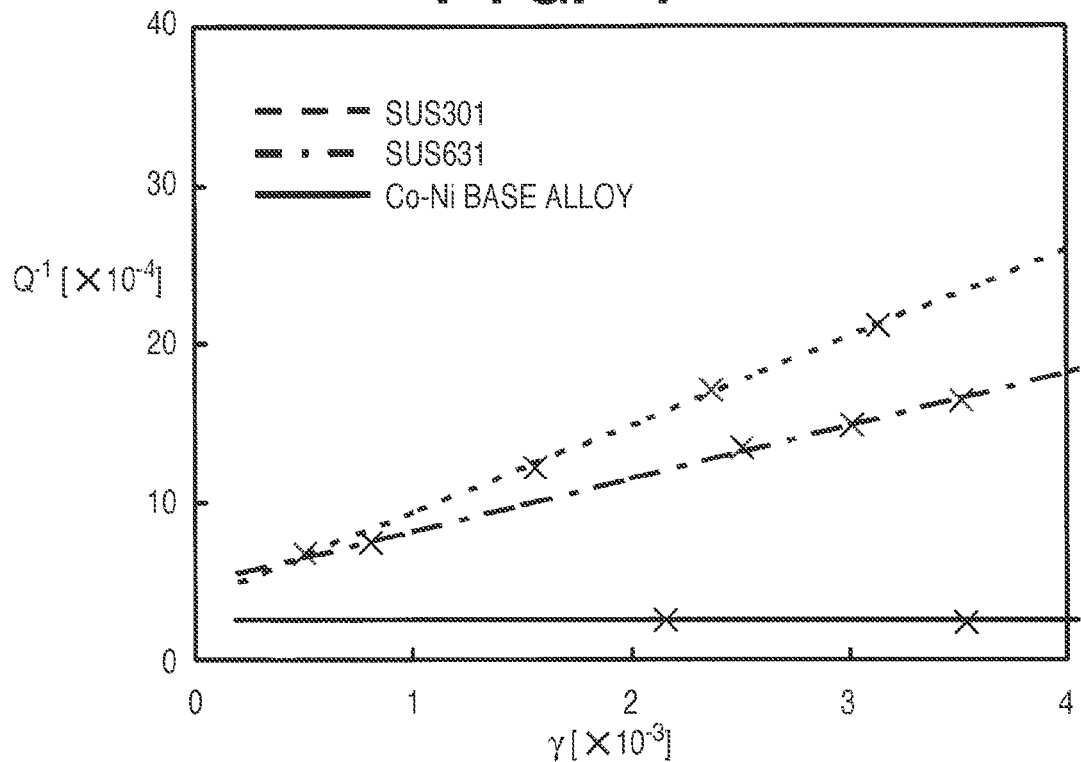
FIG. 4 is a graph showing the torsional amplitude dependence of the vibration damping factor.

FIG. 4 shows the torsional amplitude dependence of the vibration damping factor for each of a Co—Ni base alloy which has undergone work hardening and age hardening treatments and is used for the vibrating element in Example 1, and SUS301 and SUS631 used for the vibrating elements in Comparative Examples 1 and 2, respectively. Note that the torsional amplitude dependence changes depending on the cross-sectional shape and length of a beam portion 31, and is therefore expressed by converting a torsional amplitude θ into a maximum strain amplitude γ corresponding to a maximum shearing stress applied to the beam portion 31 as material characteristics that are independent of the shape. Also, FIG. 4 shows the measurement result obtained under the reduced pressure at which the air resistance is negligible, and shows a vibration damping factor $Q^{-1}$ of the material itself, that is, the vibration damping characteristics.

The vibration damping factors of SUS301 and SUS631 considerably increase with an increase in strain amplitude. Therefore, when a vibrating element (Comparative Examples 1 and 2) which uses SUS301 or SUS631 is used in a region having a large strain amplitude, it is necessary to use a large yoke as the magnetic field generating portion so as to obtain a driving force, or increase the capacity of a power supply circuit or battery, thus making it difficult to downsize the driving portion. Also, SUS631 has an amplitude damping factor with characteristics better than SUS301, but these characteristics are insufficient in a region having a large strain amplitude. In contrast to this, in the vibrating element which uses the Co—Ni base alloy which has undergone work hardening and age hardening treatments and is used in Example 1, the amplitude damping factor of the material has no strain amplitude dependence, and no large driving force is necessary even when this vibrating element is used in a region having a large strain amplitude.

Figure 5:
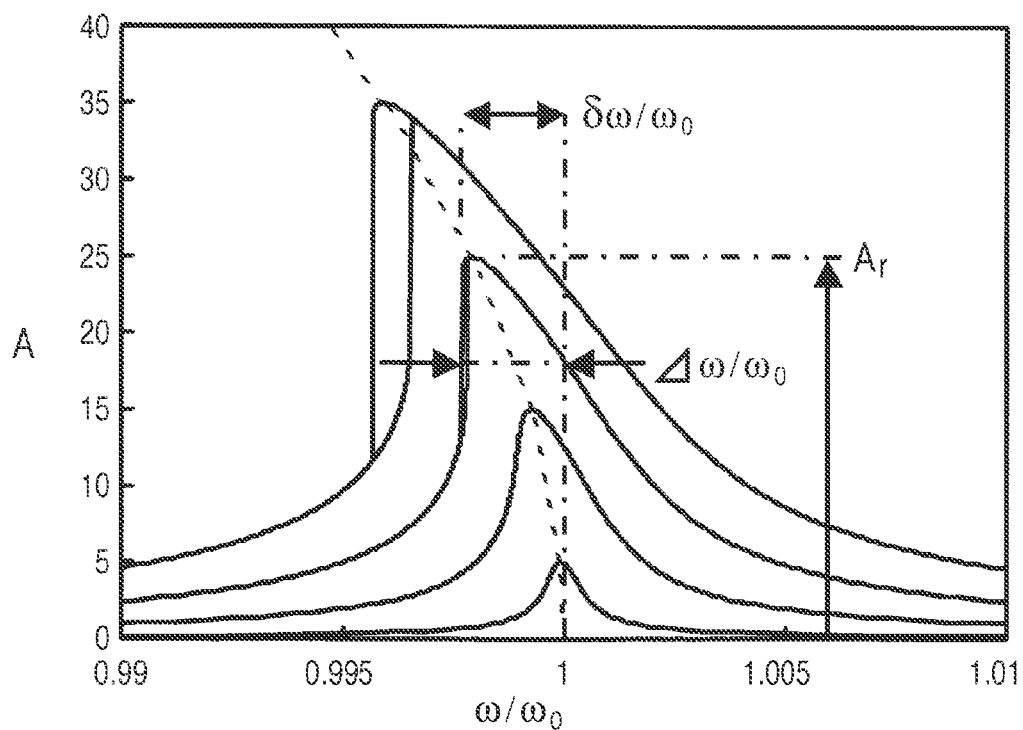
FIG. 5 is a graph showing the influence that the vibration damping factor of a material and the nonlinearity of the spring characteristics exert on the frequency characteristics of the vibrating element.

FIG. 5 shows the influence that the vibration damping factor of the material and the nonlinearity of the spring characteristics exert on the frequency characteristics of the vibrating element. The abscissa indicates the normalized frequency, and the ordinate indicates the torsional amplitude. When the spring characteristics exhibit nonlinearity, the resonance frequency at which a maximum amplitude is obtained changes with an increase in vibration amplitude. Referring to FIG. 5, the resonance frequency decreases, the gradient of the characteristics on the low frequency side becomes steep with this decrease, and hysteresis appears with an increase in vibration amplitude. As the gradient of the frequency characteristics becomes steep, the frequency region around the resonance frequency becomes unstable and hard to control. When a vibrating element having such characteristics is used, frequencies other than the resonance frequency must be used, so a large driving force generated upon forced vibration is necessary to obtain a desired vibration amplitude. This hinders downsizing of the driving portion. Hysteresis starts to occur at a vibration amplitude $A_r$ at which the amount of change in resonance frequency ($\delta\omega/\omega_0$) exceeds the vibration damping factor $Q^{-1}=(\delta\omega/\omega_0)$. This means that the vibrating element can be stably driven at the resonance frequency when the vibration amplitude falls within the range of $A_r$ or less.

Figure 6:
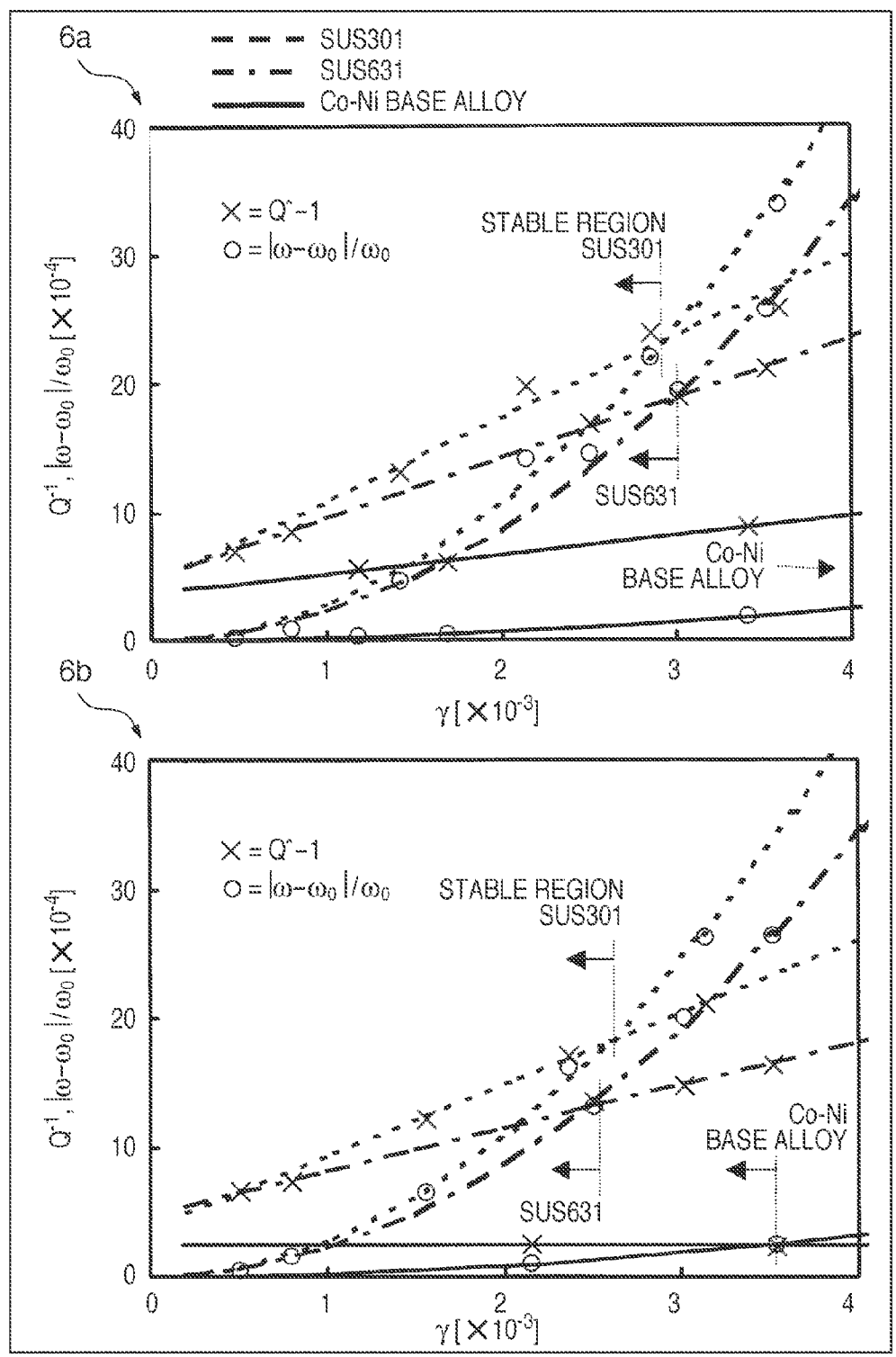
FIG. 6 shows graphs of the vibration damping factor and nonlinearity of the vibrating element.

FIG. 6 shows graphs of the vibration damping factor and nonlinearity of the vibrating element. The abscissa indicates the strain amplitude, and the ordinate indicates the vibration damping factor $Q^{-1}$ and the amount of change in resonance frequency ($\delta\omega/\omega_0$) representing the degree of nonlinearity. 6a of FIG. 6 shows the measurement result under the atmospheric pressure, and 6b of FIG. 6 shows the measurement result under the reduced pressure. The characteristics shown in 6b of FIG. 6 are obtained while the air resistance is almost negligible, and intermediate characteristics between the characteristics shown in 6a and 6b of FIG. 6 are obtained depending on the air resistance. The intersection point between the graphs of the vibration damping factor and the amount of change in resonance frequency is the allowable strain amplitude as a limit beyond which the vibrating element can no longer be stably driven at the resonance frequency, as described with reference to FIG. 5, and the vibrating element must be used at a strain amplitude which falls below the allowable strain amplitude. The graph of the vibration damping factor under the atmospheric pressure shown in 6a of FIG. 6 includes the influence of the mirror air resistance, and therefore changes depending on the mirror size and shape. The graph shown in 6a of FIG. 6 is obtained when a 2×3 mm² rectangular mirror is used. As can be seen from the graph shown in 6a of FIG. 6, the characteristics of the vibrating element made of the Co—Ni base alloy have no intersection point, so the value of the allowable strain amplitude is very large. The extrapolated value of the strain amplitude at the intersection point in the Co—Ni base alloy is three to four times that in SUS301 and SUS631.

Figure 7:
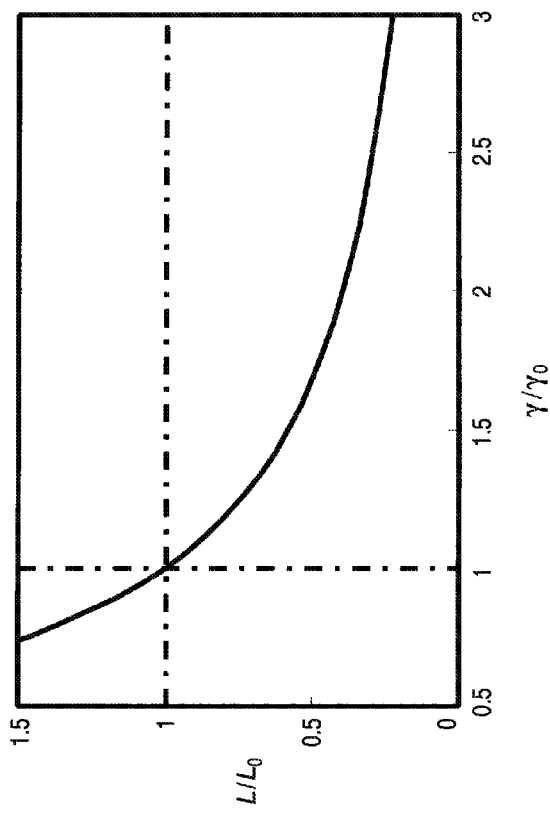
FIG. 7 is a graph showing the relationship between the rate of change in allowable strain amplitude and the rate of change in length of a beam portion.

FIG. 7 shows the relationship between the rate of change in allowable strain amplitude γ and the rate of change in length L of the beam portion 31. This graph shows the length required to obtain the same resonance frequency and the same torsional amplitude for the same mirror shape when the beam portion 31 has a circular cross-section or a rectangular cross-section having a predetermined aspect ratio. That is, FIG. 7 shows the ratio of the length L required to manufacture a vibrating portion having the same specifications as those of a vibrating portion manufactured using a material having the allowable strain amplitude γ to a length $L_0$ of the beam portion 31 when a vibrating portion manufactured using a certain material has an allowable strain amplitude $γ_0$ and includes a beam portion 31 having the length $L_0$. As can be seen from this graph, when the allowable strain amplitude increases to three to four times, the length of the beam portion 31 can be reduced to ¼ or less, and this makes it possible to greatly downsize the vibrating mirror.

In the graph shown in 6a of FIG. 6, SUS301 and SUS631 have almost the same allowable strain amplitude. This means that the vibrating element which uses SUS631 can have a driving efficiency better than that of the vibrating element which uses SUS301 because the former vibrating element has a vibration damping factor lower than the latter vibrating element, but the former vibrating element cannot be downsized. The nonlinearity of SUS631 is lower than that of SUS301 but is high enough to improve the allowable strain amplitude. For this reason, to downsize the actuator device (for example, a vibrating mirror device), it is important for both the vibration damping factor and the nonlinearity to have optimum characteristics.

Figure 8:
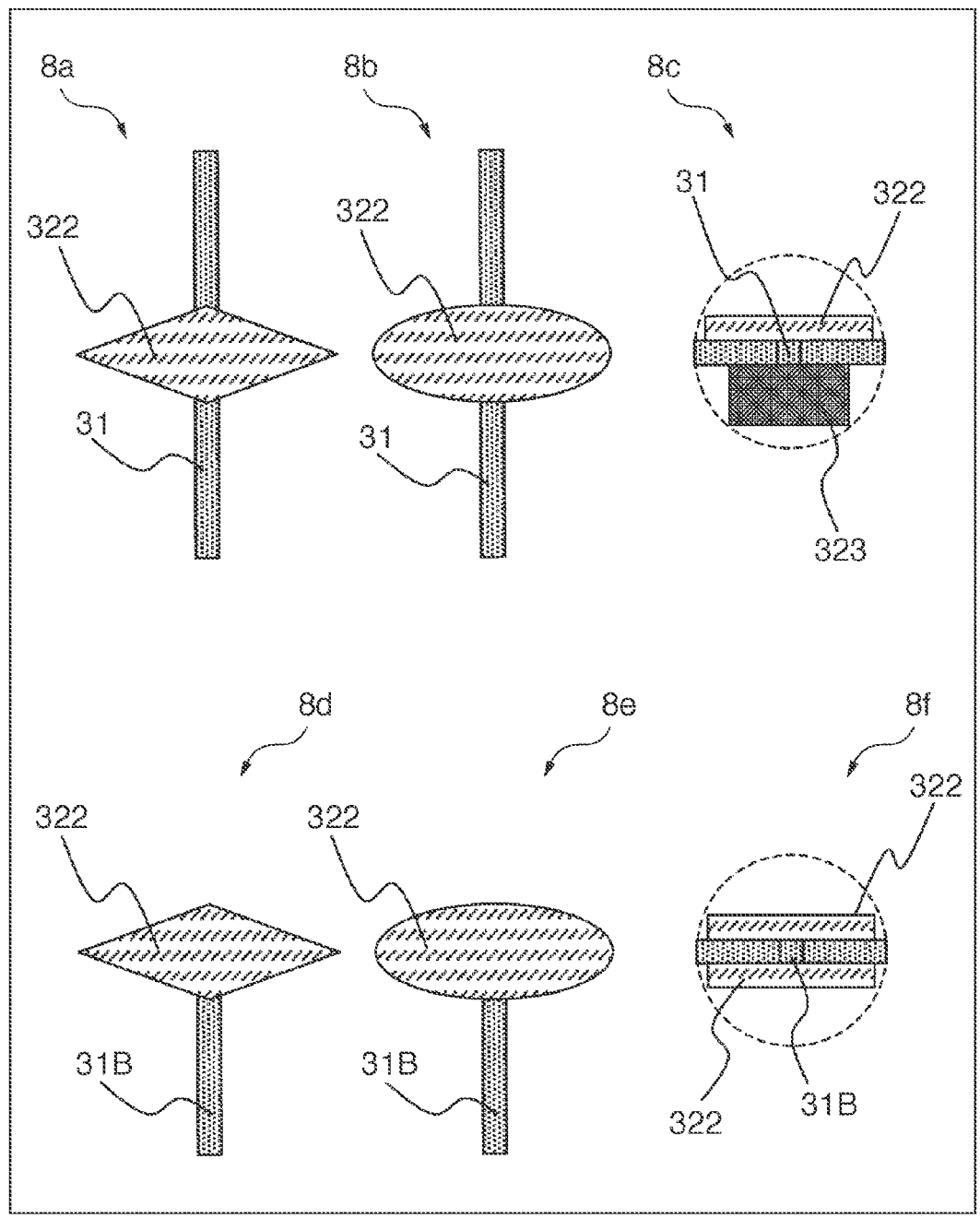
FIG. 8 illustrates schematic plan views of modifications of the shape of an optical mirror portion.

Note that the allowable strain amplitudes of SUS301 and SUS631 are smaller in the characteristics under the reduced pressure shown in 6b of FIG. 6 than in those under the atmospheric pressure shown in 6a of FIG. 6. This reveals that with a reduction in air resistance, the length of the beam portion 31 must be increased to stably operate the vibrating element at the resonance frequency. That is, when jitter is reduced by improving the location of the vibrating element 30 in the reduced-pressure space or the shape in which the portion which projects outwards from the portion opposed to the beam portion 31 of an optical mirror portion 322, as shown in 8a to 8c of FIG. 8, is tapered narrower toward its end, it is more difficult to downsize the vibrating element 30. Note that the beam portion 31 shown in 8a to 8c of FIG. 8 is a center impeller beam portion.

In contrast to this, the allowable strain amplitude of the vibrating element which uses the Co—Ni base alloy having undergone work hardening and age hardening treatments decreases, but nonetheless is kept at a value higher than those of the vibrating elements which use SUS301 and SUS631 by 40% or more. As can be seen from the graph shown in FIG. 7, the length of the beam portion 31 can be reduced to about 60% of those of the beam portions formed using SUS301 and SUS631. A countermeasure against jitter is indispensable when the vibrating element is used for, for example, a laser beam printer or laser projector required to perform beam scanning with high accuracy, so the effect of downsizing the vibrating element according to the present invention is very great for these purposes.

FIG. 9 shows the characteristic data of the vibrating elements in Example 1 and Comparative Examples 1 and 2. The "Allowable Strain Amplitude" describes an actual torsion angle, together. The "Q Value" is the reciprocal of the vibration damping factor, and describes the value when the torsional amplitude is 25°. The "Consumed Power" describes the value when the torsional amplitude is 25° as well. The value when the torsional amplitude is 25° is almost an allowable value under the reduced pressure in Comparative Examples 1 and 2, and is used to compare the characteristics of the vibrating elements under the same conditions within the range in which vibration at frequencies around the resonance frequency is stable.

When the power consumed by the vibrating element in Example 1 is compared with that consumed by the vibrating element in Comparative Example 2, the former is ⅕ or less of the latter under the atmospheric pressure, and is 1/30 of the latter under the reduced pressure, so the consumed power can be greatly reduced when the former is used. Hence, the vibrating element in Example 1 has a driving efficiency greatly higher than that in Comparative Example 1, so the actuator device can be downsized using the vibrating element in Example 1.

Also, the allowable strain amplitudes of the vibrating elements in Example 1 and Comparative Example 3 are larger than $3 \times 10^{-3}$, and are therefore greater than those of the vibrating elements in Comparative Examples 1 and 2. Note that the vibrating element in Comparative Example 3 includes a vibrating portion formed only by a work hardening treatment, and therefore has a lower Q value and consumes a higher power than that consumed by the vibrating element in Example 1, that is, has a very high vibration damping factor and low driving efficiency. This means that the vibrating element in Comparative Example 3 is disadvantageous in downsizing.

To minimize the length of the beam portion 31 in downsizing the vibrating element, it is desired to increase the strain amplitude up to the allowable value limit with respect to the required torsional amplitude. The Q value under the reduced pressure in Comparative Examples 1 and 2 shown in FIG. 9 is obtained upon the operation of the vibrating element at a strain amplitude almost equal to the allowable value limit when a minimum vibrating element is manufactured, independently of the mirror shape and the torsional amplitude. An air resistance acts on the vibrating element under the atmospheric pressure, so the Q value is lower under the atmospheric pressure than under the reduced pressure in Comparative Examples 1 and 2. This means that when a minimum vibrating element is manufactured within the range in which vibration does not become unstable, the Q values obtained when the materials in Comparative Examples 1 and 2 are about 550 to 740 and cannot be higher than 1,000.

In contrast to this, the vibrating element in Example 1 can obtain a Q value higher than 1,000 and, more specifically, a Q value higher than 4,000 under the reduced pressure when it has the same size as that of the vibrating elements in Comparative Examples 1 and 2. Also, as described above, the vibrating element in Example 1 has a large allowable value for the strain amplitude and therefore can be downsized. However, in the vibrating element in Example 1, the vibration damping factor has little strain amplitude dependence under the reduced pressure, as shown in 6b of FIG. 6, so the Q value remains the same even when the strain amplitude is increased for downsizing. That is, the present invention can achieve an improvement in Q value and downsizing of the vibrating element at once.

Also, the vibrating element in Example 1 can be downsized under the atmospheric pressure, as described above, but its Q value reduces due to the influence of the air resistance corresponding to the mirror shape and torsional amplitude. However, the vibrating element in Example 1 can obtain a Q value higher than 1,400, as shown in FIG. 9, when it has the same size as that of the vibrating elements in Comparative Examples 1 and 2. Hence, according to the present invention, a Q value higher than 1,000, which cannot be obtained when the materials in Comparative Examples 1 and 2 are used, can be attained.

Note that when a durability test was conducted for the vibrating element in Example 1 at a strain amplitude value larger than the allowable strain amplitudes of SUS301 and SUS631, a torsional amplitude of 40°, and a resonance frequency of 2 kHz, durability corresponding to $4 \times 10^{10}$ or more times (5,000 hours or more) could be attained.

Note that the characteristic data of the vibrating element in Example 1 shown in FIG. 9 was obtained by manufacturing vibrating elements having the same shape as those in Comparative Examples 1 to 3 merely for a comparison with Comparative Examples 1 to 3, and does not limit the characteristics of the present invention.

(Second Embodiment)

Figure 14:
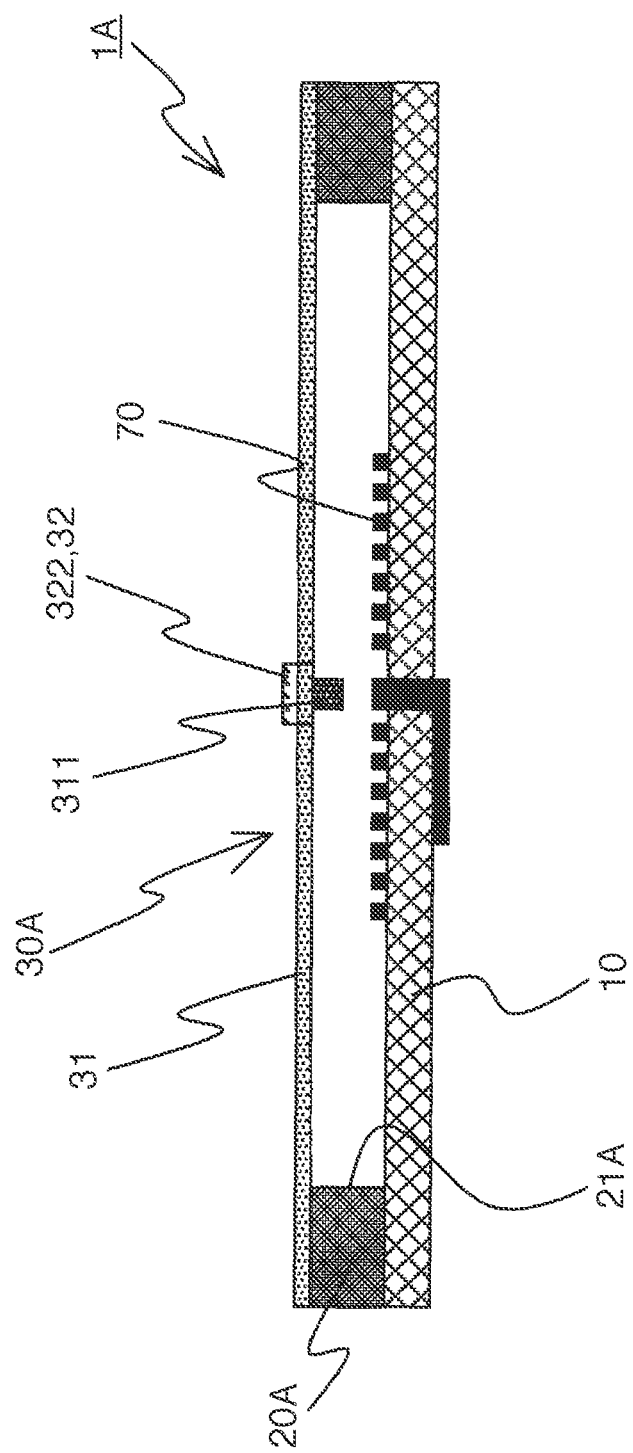
FIG. 14 is a schematic sectional view illustrating an example of an actuator device including a vibrating element according to the second embodiment.

FIG. 14 is a schematic sectional view illustrating an example of an actuator device including a vibrating element according to the second embodiment of the present invention.

An actuator device 1A in this embodiment is the same as that in the above-mentioned first embodiment except that the former has a structure in which a vibrating element 30 is open to the atmosphere, instead of providing it with a cover member which seals the vibrating element 30, as shown in FIG. 14. Note that the same reference numerals as in the above-mentioned first embodiment denote the same constituent parts in the second embodiment, and a repetitive description thereof will not be given.

More specifically, in the actuator device 1A of this embodiment, a beam portion 31 which forms a vibrating portion is open to the atmosphere, and is used at normal pressure. Also, a holding member 20A includes a through hole 21A formed at its center while its peripheral edge portion is left intact. Even in such a use environment subjected to the air resistance, the vibrating element 30 is advantageous in downsizing while ensuring desired fatigue characteristics and vibration characteristics because the beam portion 31 is formed by a Co—Ni base alloy having undergone work hardening and age hardening treatments. Note that in this embodiment, since the vibrating portion including the beam portion 31 is open to the atmosphere, it is preferable to adopt the shapes of an optical mirror portion 322 and beam portion 31B, as shown in, for example, 8d to 8f of FIG. 8, that have a relatively small area in a portion which is relatively far from the center of rotation of torsional vibration and moves at a relatively high speed, so as to reduce the influence of the air resistance.

(Third Embodiment)

Figure 15:
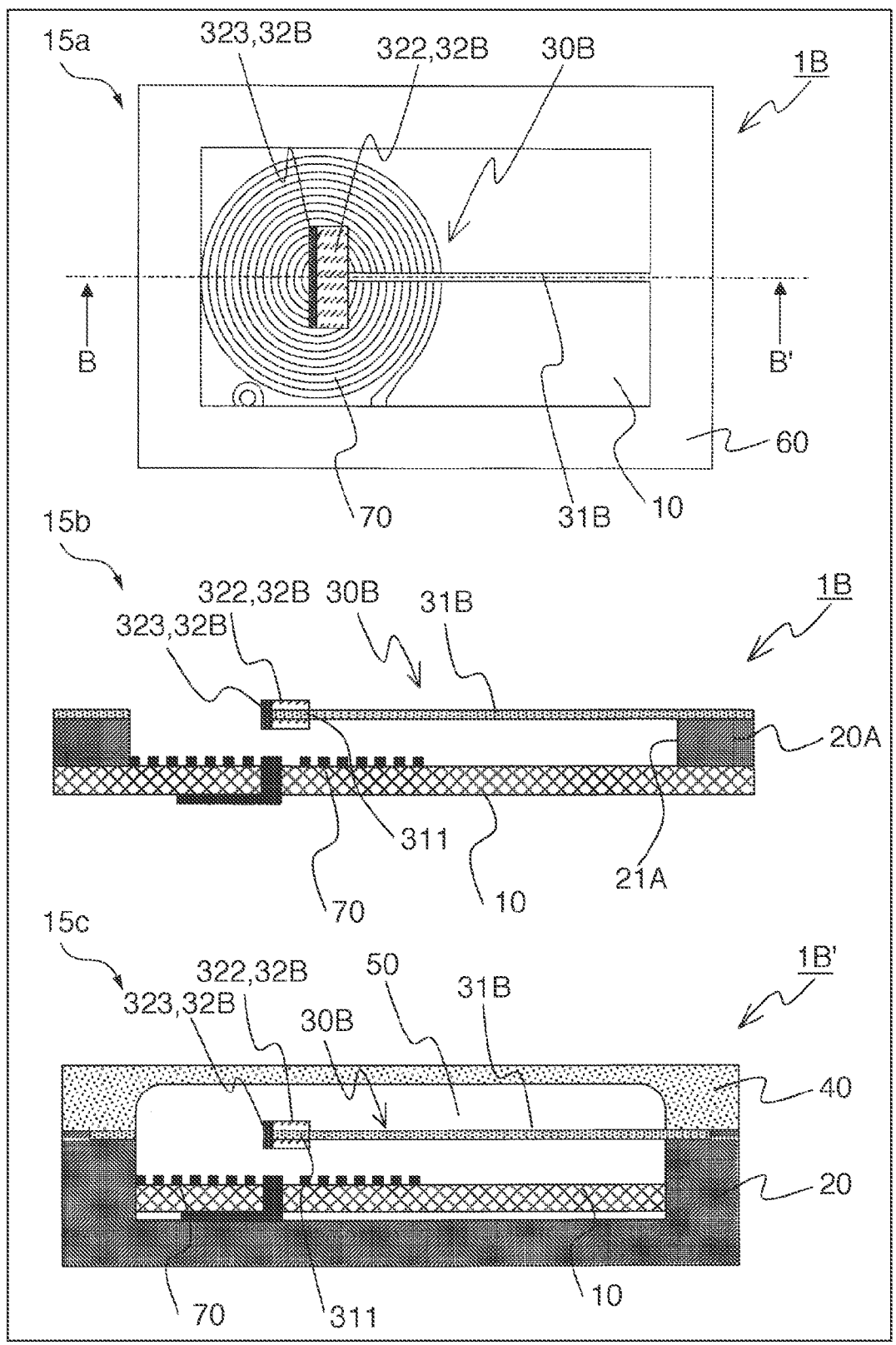
FIG. 15 shows schematic views illustrating an example of an actuator device including a vibrating element according to the third embodiment.

FIG. 15 shows schematic views illustrating an example of an actuator device including a vibrating element according to the third embodiment of the present invention, in which 15a of FIG. 15 is a top view; 15b of FIG. 15 is a sectional view taken along a line B-B'; and 15c of FIG. 15 illustrates an example of a cover mounting structure.

An actuator device 1B in this embodiment is the same as that in the above-mentioned first embodiment except that the former includes a vibrating element 30B formed by providing a cantilevered beam portion 31B, as shown in 15a and 15b of FIG. 15. Note that the same reference numerals as in the above-mentioned second embodiment denote the same constituent parts in the third embodiment, and a repetitive description thereof will not be given.

The beam portion 31B is mounted on one side of a frame 60, that is, cantilevered on the frame 60, as shown in 15a and 15b of FIG. 15. Also, a mass body 32B is placed at the distal end of the beam portion 31B on the free end side. Upon adoption of such a structure, the center of gravity of the mass body 32B is positioned on an extension line of the beam portion 31B to allow stable vibration even in a configuration in which the beam portion 31B is cantilevered.

In this configuration, to prevent flexure especially due to self weight, it is desired to set the Young's modulus higher in the longitudinal direction of the beam portion 31B, that is, it is preferable to form the beam portion 31B in the direction in which a <110> texture is formed.

Also, by providing a cover member 40, as in the above-mentioned first embodiment, while the structure of the actuator device 1B is adopted, and placing the vibrating element 30B in a reduced-pressure space 50, the air resistance can be reduced to obtain stable vibration characteristics, as shown in 15c of FIG. 15.

(Fourth Embodiment)

Figure 16:
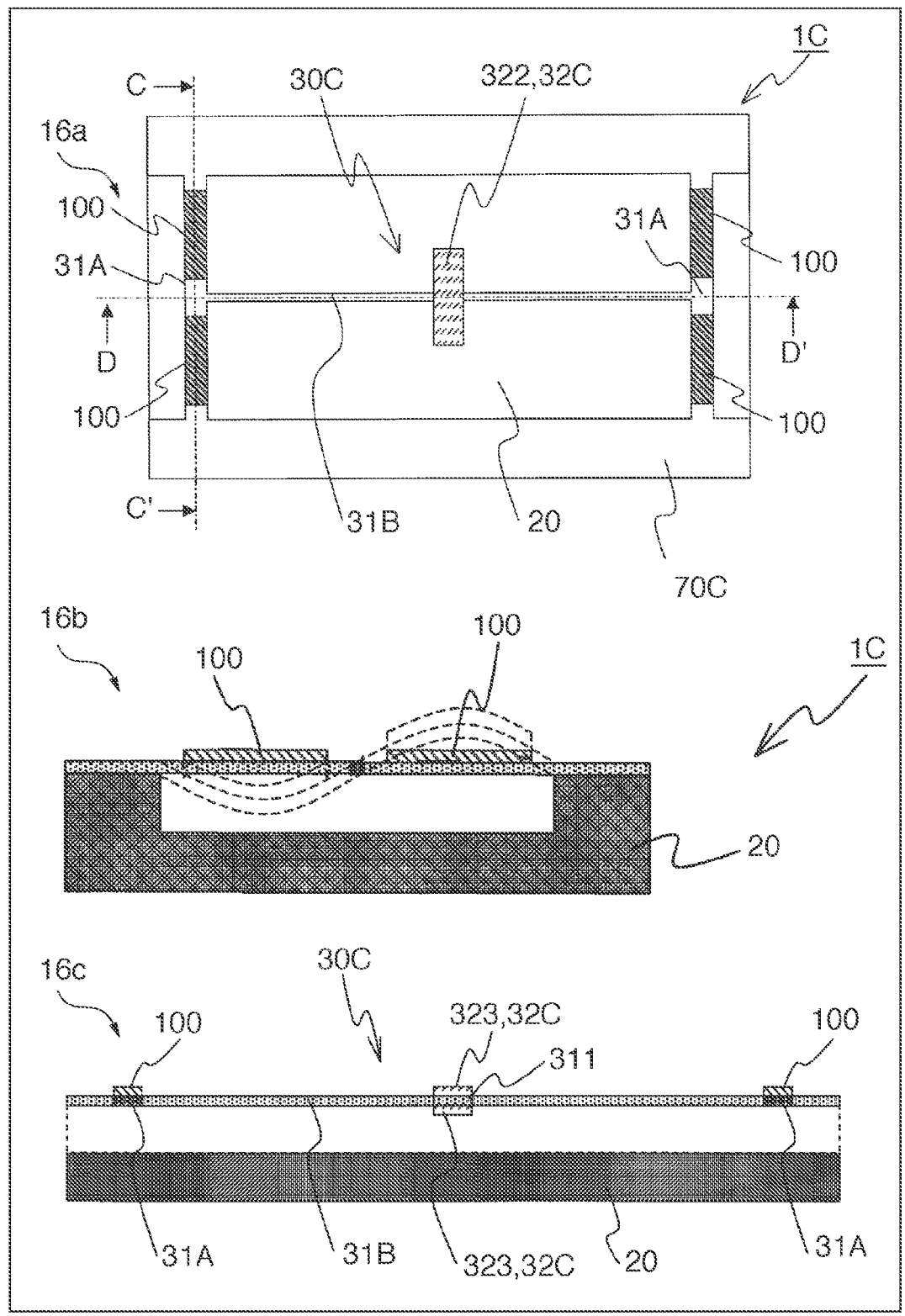
FIG. 16 illustrates schematic views of an example of an actuator including a vibrating element according to the fourth embodiment.

FIG. 16 shows schematic views illustrating an example of an actuator device including a vibrating element according to the fourth embodiment of the present invention, in which 16a of FIG. 16 is a top view; 16b of FIG. 16 is a sectional view taken along a line C-C'; and 16c of FIG. 16 is a sectional view taken along a line D-D'.

An actuator device 1C in this embodiment includes a pair of first beam portions 31A suspended from a frame 70C in a beam shape, and a second beam portion 31B which connects the pair of first beam portions 31A to each other, as shown in FIG. 16. Also, in the actuator device 1C, a plurality of piezoelectric elements 100 capable of externally applying voltages are arranged on the pair of first beam portions 31A, and a mass body 32C is placed on the second beam portion 31B, thereby forming a vibrating element 30C. Other features in the fourth embodiment are the same as in the above-mentioned first embodiment. Note that the same reference numerals as in the above-mentioned first embodiment denote the same constituent parts in the fourth embodiment, and a repetitive description thereof will not be given.

More specifically, each of the pair of first beam portions 31A suspended from the frame 70C in almost parallel includes the piezoelectric elements 100 on the two sides of the connecting portion to the second beam portion 31B. Note that the piezoelectric elements 100 are formed by staking a piezoelectric film made of, for example, lead zirconate titanate, barium titanate, lead titanate, or lead niobate, and an upper electrode (not shown). Although not shown, a voltage is applied from a driving circuit to each piezoelectric element 100 via the frame 70C and the upper electrode to generate flexural vibration in opposite directions in the piezoelectric elements 100, thereby applying a torsion torque to the pair of first beam portions 31A. Upon this operation, torsional vibration is excited in the vibrating element 30C. Optical mirror portions 322C are located on the two surfaces of a mirror mounting portion 311C. Upon adoption of such a structure, deformation of the optical mirror portions 322C is prevented by maintaining the balance of film stress when a reflecting film is formed, and the balance of the center of gravity is maintained when a mirror-finished member is connected to the mirror mounting portion 311C.

The mass body 32C, first beam portions 31A, and second beam portion 31B formed integrally with the frame 70C are made of a work hardening and age hardening type Co—Ni base alloy, as in the above-mentioned first embodiment. When a piezoelectric film which poses a problem resulting from the reaction between a metal material and lead upon a heat treatment, such as a piezoelectric film made of lead zirconate titanate (PZT), is used for the piezoelectric elements 100, an interlayer which prevents diffusion of the lead is preferably formed between the metal material and the piezoelectric film to improve the piezoelectric characteristics. Note that the piezoelectric elements 100 are preferably formed using the aerosol deposition method (AD method).

The first beam portions 31A having the piezoelectric elements 100 formed on them undergo a heat treatment, together with the piezoelectric elements 100, to achieve both an improvement in characteristic of the piezoelectric elements 100 and age hardening of the Co—Ni base alloy at once. This makes it possible to simplify the manufacturing process. The heat treatment is desirably performed in a reducing atmosphere at 500° C. to 700° C. for 1 to 3 hours. At this time, since the Co—Ni base alloy after age hardening is excellent in thermal resistance, it is also possible to form piezoelectric elements 100 on the Co—Ni base alloy after age hardening, and perform a heat treatment for the piezoelectric film.

The characteristics of the vibrating element 30C are the same as in the above-mentioned first embodiment, and the vibrating element 30C can similarly be downsized. Also, in this embodiment, the driving voltages of the piezoelectric elements 100 can be greatly lower than those of piezoelectric elements 100 arranged by, for example, bonding, so a driving portion such as a power supply circuit can be downsized.

Note that this embodiment provides a modification of the structure of the actuator device 1C, and can produce the same effect as in the above-mentioned first embodiment in terms of using a work hardening and age hardening type Co—Ni base alloy for the first beam portions 31A and second beam portion 31B.

(Fifth Embodiment)

Figure 17:
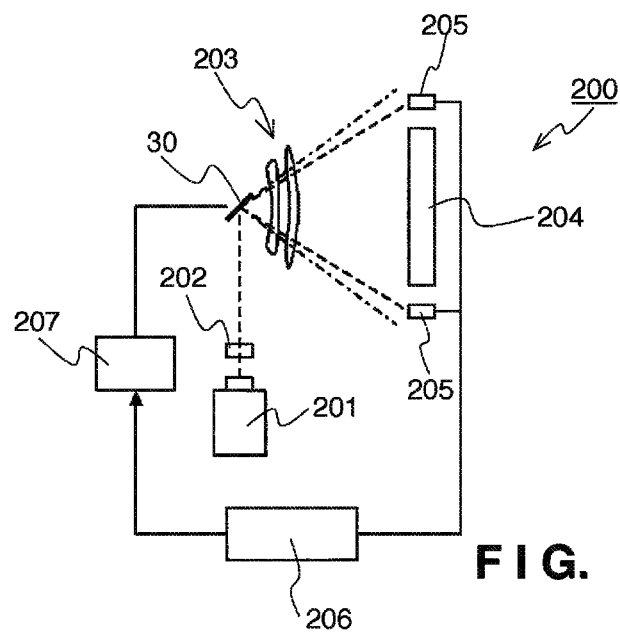
FIG. 17 is a schematic block diagram showing an image forming apparatus including a vibrating element according to the fifth embodiment.

FIG. 17 is a schematic block diagram showing an image forming apparatus including a vibrating element according to the fifth embodiment of the present invention.

An image forming apparatus 200 in this embodiment is applicable to, for example, the vibrating element 30 (a vibrating element 30 is shown in FIG. 17) described in each of the above-mentioned first to fourth embodiments, as shown in FIG. 17. The image forming apparatus 200 is, for example, a laser beam printer (LBP). Light emitted by a laser light 201 is reflected by the optical mirror portion of the vibrating element 30 upon passing through an exit optical system 202, and is scanned on a photosensitive body 204 upon passing through an imaging optical system 203. The scanned laser light is detected by a BD sensor 205, a control signal for the scan angle is output from a control circuit 206 based on a detection signal obtained by the BD sensor 205, and the control signal is fed back to a driving circuit 207 of the vibrating element 30. The image forming apparatus 200 in this embodiment includes the vibrating element 30 including a vibrating portion (beam portion) made of a work hardening and age hardening type Co—Ni base alloy, and is therefore advantageous in downsizing. This reduces instability such as jitter to allow stable laser light scanning, and, in turn, to allow accurate control of the scan angle.

(Sixth Embodiment)

Figure 18:
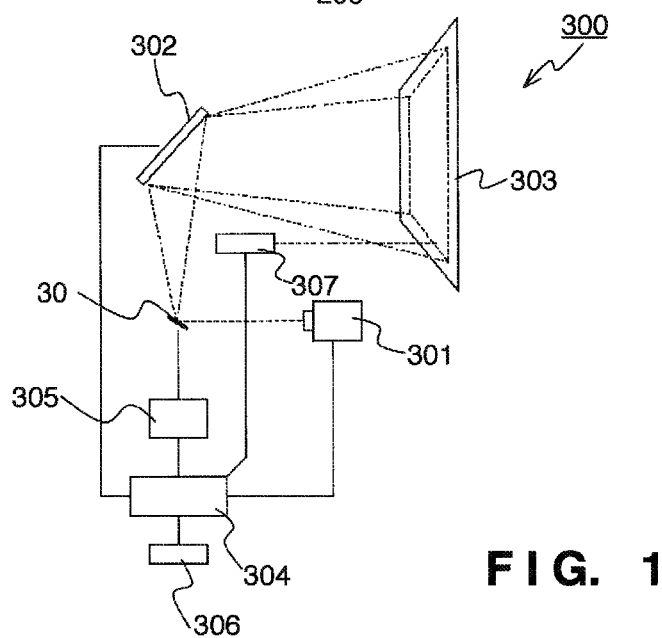
FIG. 18 is a schematic block diagram showing a video projection apparatus including a vibrating element according to the sixth embodiment.

FIG. 18 is a schematic block diagram showing a video projection apparatus including a vibrating element according to the sixth embodiment of the present invention.

A video projection apparatus 300 in this embodiment is applicable to, for example, the vibrating element 30 (a vibrating element 30 is shown in FIG. 18) described in each of the above-mentioned first to fourth embodiments, as shown in FIG. 18. Light emitted by a light source 301 including the three RGB primary colors is guided onto a mirror surface placed on the vibrating element 30, is two-dimensionally scanned by a vertical scanning device 302, and is projected onto a screen 303 as a video.

Also, the scanning speed of the vertical scanning device 302 is lower than that of the vibrating element 30. The vertical scanning device 302 uses a galvanomirror capable of accurate positioning by nonresonant driving. The scan angle of the vibrating element 30 is controlled by a driving circuit 305 based on a control signal output from a control circuit 304. The scan angle of the vertical scanning device 302 is also controlled based on the output from the control circuit 304. The control circuit 304 changes the settings of the field angle of projection and the projection size of the video projection apparatus 300 by an input unit 306 and a distance measuring device 307, and the scan angles of the vibrating element 30 and vertical scanning device 302 based on the size and aspect ratio of the video. The projection size of the video can be changed by ON/OFF control of the light source 301 without changing the scan angle. Nevertheless, changing the scan angle makes it possible to shorten the OFF time of the light source 301, thereby effectively using light.

The video projection apparatus 300 in this embodiment includes the vibrating element 30 including a vibrating portion which forms a beam portion made of a work hardening and age hardening type Co—Ni base alloy, and is therefore advantageous in downsizing but nonetheless can reduce instability such as jitter to allow a stable operation even when the scan angle is changed. Also, the strain amplitude dependence of the vibration damping factor is so low that the consumed power does not rapidly increase upon an increase in scan angle. Further, the driving power of the light source 301 can be reduced by effectively using light. For these reasons, in addition to downsizing, it is possible to reduce the volumes of the driving portion and battery and, in turn, to attain the compact, high-functionality video projection apparatus 300.

The present invention is not limited to the above-described embodiments, and various changes and modifications can be made within the spirit and scope of the present invention. Therefore, to apprise the public of the scope of the present invention, the following claims are made.

This application claims the benefit of Japanese Patent Application No. 2009-284738, filed Dec. 16, 2009, which is hereby incorporated by reference herein in its entirety.

The invention claimed is:

1. A vibrating element comprising a vibrating portion which includes a beam portion formed by performing a work hardening treatment which decreases a Young's modulus, and an age hardening treatment which recovers or increases the Young's modulus decreased by the work hardening treatment,
    wherein said vibrating portion is formed by a metallic material having a face-centered cubic lattice structure,
    wherein said vibrating portion has characteristics defined by a resonance characteristic curve, which represents a relationship between a driving frequency and strain amplitude and has a peak shape which changes from an axisymmetric shape to an asymmetric shape with an increase in the strain amplitude, and
    wherein said vibrating portion is driven using a range in which the peak shape shows the axisymmetric shape.

2. The vibrating element according to claim 1, wherein said beam portion is formed by performing a shaping process, in which a workpiece having undergone the work hardening treatment which decreases a Young's modulus is formed into a predetermined shape, and then undergoes the age hardening treatment which recovers or increases the Young's modulus decreased by the work hardening treatment.

3. The vibrating element according to claim 1, wherein said beam portion is suspended from a base of said vibrating portion in a beam shape, and said vibrating portion torsionally vibrates in a direction in which said vibrating portion intersects with a longitudinal axis line of said beam portion.

4. The vibrating element according to claim 1, wherein said beam portion is formed by stretching.

5. The vibrating element according to claim 4, wherein said beam portion is formed by ironing, in addition to the stretching.

6. The vibrating element according to claim 4, wherein said beam portion is formed by ironing while linearly stretching said vibrating portion.

7. The vibrating element according to claim 4, wherein a trace is formed in an outer peripheral surface of said beam portion by the stretching.

8. The vibrating element according to claim 1, wherein said beam portion is suspended from a base of said vibrating portion in a beam shape, and has a cross-section aspect ratio t/w higher than 0.3 where w is a width of said beam portion, and t is a thickness of said beam portion.

9. The vibrating element according to claim 1, wherein said beam portion is suspended from a base of said vibrating portion in a beam shape, and said vibrating portion includes an optical mirror portion having a moment of inertia of not less than twice a moment of inertia of said beam portion.

10. The vibrating element according to claim 1, wherein said beam portion includes a first region and a second region which are formed in an elongated beam shape and in which an optical mirror portion is not mounted, and a third region in which said optical mirror portion is mounted, said second region being sandwiched between said first region and said third region in a longitudinal direction of said vibrating portion, and
the age hardening treatment is performed at a temperature which is different between said first region and said second region, and said third region.

11. The vibrating element according to claim 1, wherein said beam portion has vibration characteristics defined by a resonance characteristic curve which represents a relationship between an amount of change in resonance frequency and a strain amplitude and has an axisymmetric peak shape.

12. The vibrating element according to claim 1, wherein said beam portion has a strain amplitude larger than $3 \times 10^{-3}$.

13. The vibrating element according to claim 1, wherein said beam portion has a Q value which represents a degree of ease in vibration and is not less than 1,000.

14. The vibrating element according to claim 1, wherein said beam portion is formed by a work hardening and age hardening type Co—Ni base alloy.

15. The vibrating element according to claim 1, wherein said beam portion is formed by a Co—Ni base alloy having undergone a work hardening treatment and an age hardening treatment.

16. The vibrating element according to claim 1, further comprising a reduced-pressure space forming portion which forms a reduced-pressure space in which at least part of said vibrating portion is located.

17. The vibrating element according to claim 1, further comprising:
an optical mirror portion mounted on said vibrating portion,
wherein said optical mirror portion is mounted on said vibrating portion, and has an outer shape larger than a width of said vibrating portion and a shape in which a portion which projects outwards from a portion opposed to said vibrating portion is tapered narrower toward an end thereof.

18. The vibrating element according to claim 1, wherein said beam portion contains, as a composition thereof, Co, Ni, Cr, and Mo at a weight ratio of 31.0% to 37.3%, 31.4% to 33.4%, 19.5% to 20.5%, and 9.5% to 10.5%, respectively.

19. The vibrating element according to claim 1, wherein said beam portion exhibits nonmagnetism.

20. The vibrating element according to claim 1, wherein said beam portion is one of a center impeller vibrating portion and a cantilevered vibrating portion.

21. A vibrating element comprising:
a vibrating portion which is formed by a metallic material having a face-centered cubic lattice structure; and
a driving portion which vibrates said vibrating portion,
wherein said vibrating portion has characteristics defined by a resonance characteristic curve, which represents a relationship between a driving frequency and strain amplitude and has a peak shape which changes from an axisymmetric shape to an asymmetric shape with an increase in the strain amplitude, and
wherein said vibrating portion is driven using a range in which the peak shape shows the axisymmetric shape.

* * * * *